US008912548B2

(12) United States Patent
Cho et al.

(10) Patent No.: US 8,912,548 B2
(45) Date of Patent: Dec. 16, 2014

(54) ORGANIC LIGHT-EMITTING DIODE COMPRISING AMINE-BASED COMPOUNDS AND ANTHRACENE-BASED COMPOUNDS

(71) Applicants: Samsung Display Co., Ltd., Yongin, Gyeonggi-Do (KR); Seoul National University R&DB Foundation, Seoul (KR)

(72) Inventors: Hwan-Hee Cho, Yongin (KR); Mi-Kyung Kim, Yongin (KR); Se-Hun Kim, Yongin (KR); Chang-Woong Chu, Yongin (KR); Myoung-Ki Kim, Yongin (KR); Jong-In Hong, Seoul (KR)

(73) Assignees: Samsung Display Co., Ltd., Yongin-si (KR); Seoul National University R&DB Foundation, Seoul (KR)

( * ) Notice: Subject to any disclaimer, the term of this patent is extended or adjusted under 35 U.S.C. 154(b) by 0 days.

(21) Appl. No.: 13/942,641

(22) Filed: Jul. 15, 2013

(65) Prior Publication Data
US 2014/0197383 A1    Jul. 17, 2014

(30) Foreign Application Priority Data

Jan. 11, 2013    (KR) .................. 10-2013-0003507

(51) Int. Cl.
*H01L 21/67*    (2006.01)
*H01L 51/50*    (2006.01)
*H01L 51/00*    (2006.01)

(52) U.S. Cl.
CPC .......... *H01L 51/006* (2013.01); *H01L 51/5012* (2013.01); *H01L 51/0062* (2013.01); *H01L 51/0061* (2013.01)
USPC .............................. 257/72; 257/89

(58) Field of Classification Search
CPC ............ H01L 21/0202; H01L 21/0241; H01L 21/02104; H01L 21/64; H01L 21/67; H01L 21/6705; H01L 21/673; H01L 21/677; H01L 21/783; H01L 21/70; H01L 51/5012; H01L 51/0067; H01L 51/006; H01L 51/00617
USPC ........................................ 257/57–67, 89–92
See application file for complete search history.

(56) References Cited

U.S. PATENT DOCUMENTS

| 7,501,189 | B2 | 3/2009 | Tokailin et al. | |
|---|---|---|---|---|
| 7,651,786 | B2 | 1/2010 | Matsuura et al. | |
| 2007/0278941 | A1* | 12/2007 | Zheng et al. | 313/504 |
| 2007/0285010 | A1* | 12/2007 | Lee et al. | 313/504 |
| 2011/0042660 | A1 | 2/2011 | Kawamura et al. | |
| 2011/0186821 | A1* | 8/2011 | Schafer et al. | 257/40 |
| 2014/0158859 | A1* | 6/2014 | Fukuzaki et al. | 250/200 |
| 2014/0183466 | A1* | 7/2014 | Lee et al. | 257/40 |
| 2014/0183495 | A1* | 7/2014 | Lee et al. | 257/40 |

* cited by examiner

FOREIGN PATENT DOCUMENTS

| KR | 10-2007-0033339 | 3/2007 |
|---|---|---|
| KR | 10-2009-0111356 | 10/2009 |
| KR | 10-2010-0121489 | 11/2010 |

*Primary Examiner* — Michael Lebentritt
(74) *Attorney, Agent, or Firm* — Christie, Parker & Hale, LLP

(57) ABSTRACT

An organic light-emitting diode includes a first electrode, a second electrode, and an organic layer disposed between the first electrode and the second electrode. The organic layer includes an emission layer. The organic layer also includes at least one amine-based compound and at least one anthracene-based compound. The organic layer may include a first emission layer and a second emission layer, and the amine-based compound may be in the first emission layer and the anthracene-based compound may be in the second emission layer.

20 Claims, 1 Drawing Sheet

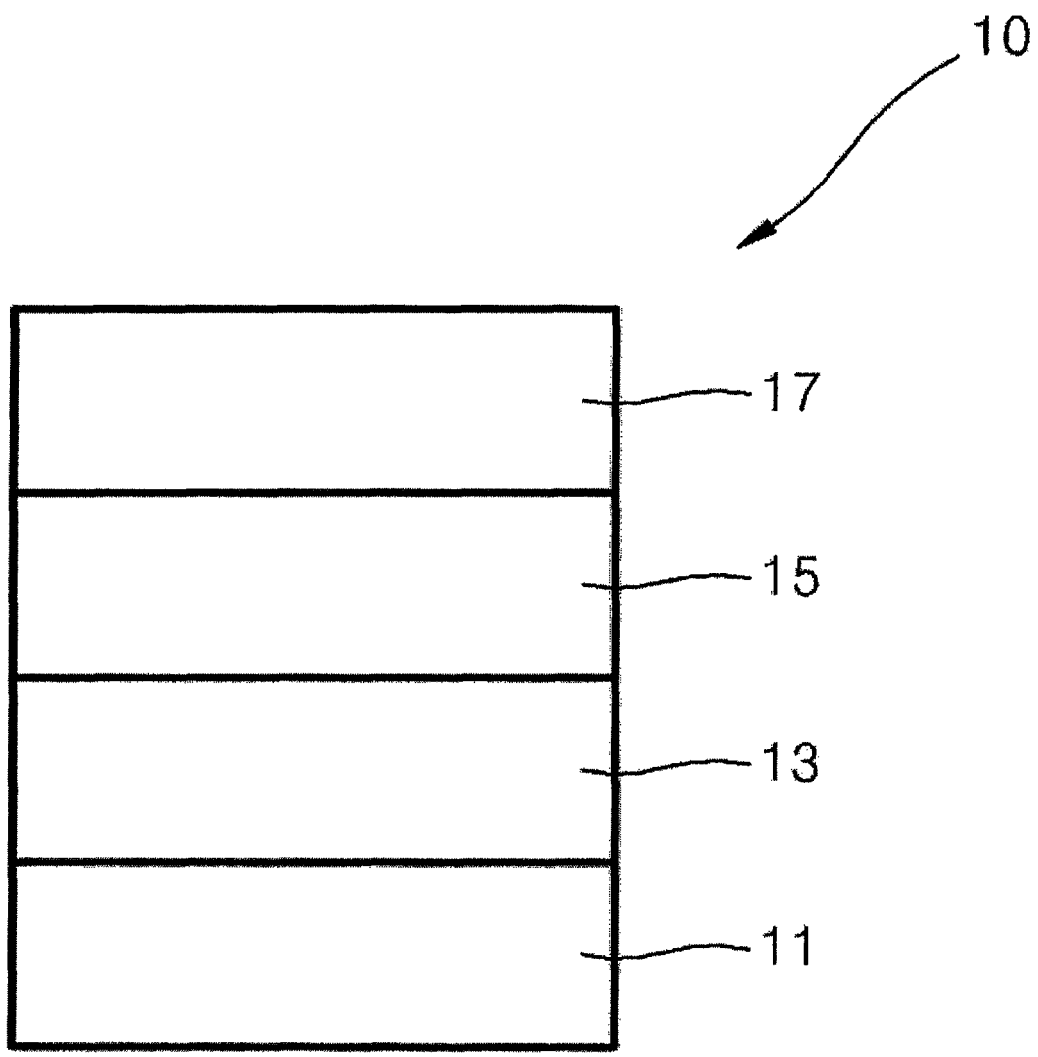

ORGANIC LIGHT-EMITTING DIODE COMPRISING AMINE-BASED COMPOUNDS AND ANTHRACENE-BASED COMPOUNDS

CROSS-REFERENCE TO RELATED PATENT APPLICATION

This application claims priority to and the benefit of Korean Patent Application No. 10-2013-0003507, filed on Jan. 11, 2013 in the Korean Intellectual Property Office, the entire content of which is incorporated herein by reference.

BACKGROUND

1. Technical Field

The present invention relates to organic light-emitting diodes comprising amine-based compounds and anthracene-based compounds.

2. Description of the Related Art

Organic light-emitting devices (OLEDs) are self-emitting devices that have advantages such as wide viewing angles, good contrast, quick response speeds, high brightness, and good driving voltage characteristics. Also, OLEDs can provide multicolored images.

A typical OLED has a structure including a substrate, and an anode, a hole transport layer, an emission layer, an electron transport layer, and a cathode sequentially stacked on the substrate. In this regard, the hole transport layer, the emission layer, and the electron transport layer are organic thin films formed of organic compounds.

An operating principle of an OLED having the above-described structure is as follows:

When a voltage is applied between the anode and the cathode, holes injected from the anode move to the emission layer via the hole transport layer, and electrons injected from the cathode move to the emission layer via the electron transport layer. The holes and electrons recombine in the emission layer to generate excitons. When the excitons drop from an excited state to a ground state, light is emitted.

SUMMARY OF THE INVENTION

Embodiments of the present invention are directed to a high definition organic light-emitting diode (OLED).

According to an aspect of the present invention, an organic light-emitting diode (OLED) includes a first electrode, a second electrode, and an organic layer between the first electrode and the second electrode and including an emission layer. The organic layer includes at least one amine-based compound represented by Formula 1 below and at least one anthracene-based compound represented by Formula 2 below:

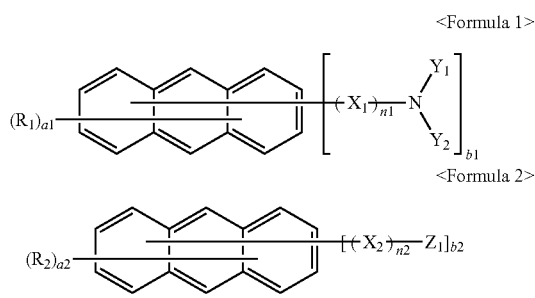

In Formulas 1 and 2, $X_1$ and $X_2$ may each independently be a substituted or unsubstituted $C_3$-$C_{10}$ cycloalkylene group, a substituted or unsubstituted $C_2$-$C_{10}$ heterocycloalkylene group, a substituted or unsubstituted $C_3$-$C_{10}$ cycloalkenylene group, a substituted or unsubstituted $C_2$-$C_{10}$ heterocycloalkenylene group, a substituted or unsubstituted $C_6$-$C_{60}$ arylene group, or a substituted or unsubstituted $C_2$-$C_{60}$ heteroarylene group.

n1 and n2 may each independently be an integer of 0 to 5. If n1 is an integer of 2 or more, then the 2 or more $X_1$ groups may be the same or different, and if n2 is an integer of 2 or more, then the 2 or more $X_2$ groups may be the same or different.

$Y_1$ and $Y_2$ may each independently be a hydrogen atom, a deuterium atom, a halogen atom, a hydroxyl group, a cyano group, a nitro group, an amino group, an amidino group, a hydrazine, a hydrazone, a carboxylic acid group or a salt thereof, a sulfonic acid group or a salt thereof, a phosphoric acid group or a salt thereof, a substituted or unsubstituted $C_{10}C_{30}$ alkyl group, a substituted or unsubstituted $C_2$-$C_{60}$ alkenyl group, a substituted or unsubstituted $C_2$-$C_{60}$ alkynyl group, a substituted or unsubstituted $C_3$-$C_{10}$ cycloalkyl group, a substituted or unsubstituted $C_2$-$C_{10}$ heterocycloalkyl group, a substituted or unsubstituted $C_3$-$C_{10}$ cycloalkenyl group, a substituted or unsubstituted $C_2$-$C_{10}$ heterocycloalkenyl group, a substituted or unsubstituted $C_6$-$C_{30}$ aryl group, or a substituted or unsubstituted $C_2$-$C_{30}$ heteroaryl group.

$Z_1$ may be an electron transporting group, and may be a substituted or unsubstituted $C_2$-$C_{10}$ heterocycloalkyl group, a substituted or unsubstituted $C_2$-$C_{10}$ heterocycloalkenyl group, or a substituted or unsubstituted $C_2$-$C_{60}$ heteroaryl group.

$R_1$ and $R_2$ may each independently be a hydrogen atom, a deuterium atom, a halogen atom, a hydroxyl group, a cyano group, a nitro group, an amino group, an amidino group, a hydrazine, a hydrazone, a carboxylic acid group or a salt thereof, a sulfonic acid group or a salt thereof, a phosphoric acid group or a salt thereof, a substituted or unsubstituted $C_1$-$C_{60}$ alkyl group, a substituted or unsubstituted $C_2$-$C_{60}$ alkenyl group, a substituted or unsubstituted $C_2$-$C_{60}$ alkynyl group, a substituted or unsubstituted $C_1$-$C_{60}$ alkoxy group, a substituted or unsubstituted $C_3$-$C_{10}$ cycloalkyl group, a substituted or unsubstituted $C_2$-$C_{10}$ heterocycloalkyl group, a substituted or unsubstituted $C_3$-$C_{10}$ cycloalkenyl group, a substituted or unsubstituted $C_2$-$C_{10}$ heterocycloalkenyl group, a substituted or unsubstituted $C_6$-$C_{60}$ aryl group, a substituted or unsubstituted $C_6$-$C_{60}$ aryloxy group, a substituted or unsubstituted $C_6$-$C_{60}$ arylthio group, or a substituted or unsubstituted $C_2$-$C_{60}$ heteroaryl group.

a1 and a2 may each independently be an integer of 0 to 9. If a1 is an integer of 2 or more, then the 2 or more $R_1$ groups may be the same or different, and if a2 is an integer of 2 or more, then the 2 or more $R_2$ groups may be the same or different.

b1 and b2 may each independently be an integer of 1 or 2.

The OLED including the amine-based compounds and the anthracene-based compounds may have high efficiency and a long lifespan.

DETAILED DESCRIPTION OF THE DRAWINGS

The above and other features and advantages of the present invention will become more apparent by reference to the following detailed description, when considered in conjunction with the attached drawings in which:

FIG. 1 is a schematic view of a structure of an organic light-emitting diode according to an embodiment of the present invention.

DETAILED DESCRIPTION OF THE INVENTION

In the present specification, the expression "organic layer includes at least one amine-based compound represented by Formula 1 and at least one anthracene-based compound represented by Formula 2" may be construed as "the organic layer includes one amine-based compound of Formula 1 or two different amine-based compounds of Formula 1, one anthracene-based compound of Formula 2 or two different anthracene-based compounds of Formula 2."

In the present specification, the term "organic layer" refers to a single layer and/or a plurality of layers between a first electrode and a second electrode.

According to embodiments of the present invention, an organic light-emitting diode (OLED) includes a first electrode; a second electrode; and an organic layer between the first electrode and the second electrode. The organic layer includes an emission layer (EML) including at least one amine-based compound represented by Formula 1 below and at least one anthracene-based compound represented by Formula 2 below:

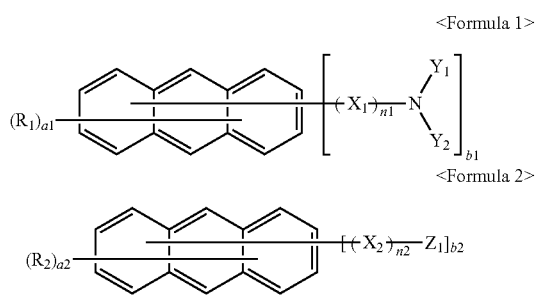

<Formula 1>
<Formula 2>

In Formulas 1 and 2, $X_1$ and $X_2$ may each independently be a substituted or unsubstituted $C_3$-$C_{10}$ cycloalkylene group, a substituted or unsubstituted $C_2$-$C_{10}$ heterocycloalkylene group, a substituted or unsubstituted $C_3$-$C_{10}$ cycloalkenylene group, a substituted or unsubstituted $C_2$-$C_{10}$ heterocycloalkenylene group, a substituted or unsubstituted $C_6$-$C_{60}$ arylene group, or a substituted or unsubstituted $C_2$-$C_{60}$ heteroarylene group.

n1 and n2 may each independently be an integer of 0 to 5. If n1 is an integer of 2 or more, the 2 or more $X_1$ groups may be the same or different, and if n2 is an integer of 2 or more, the 2 or more $X_2$ groups may be the same or different.

$Y_1$ and $Y_2$ may each independently be a hydrogen atom, a deuterium atom, a halogen atom, a hydroxyl group, a cyano group, a nitro group, an amino group, an amidino group, a hydrazine, a hydrazone, a carboxylic acid group or a salt thereof, a sulfonic acid group or a salt thereof, a phosphoric acid group or a salt thereof, a substituted or unsubstituted $C_1$-$C_{30}$ alkyl group, a substituted or unsubstituted $C_2$-$C_{60}$ alkenyl group, a substituted or unsubstituted $C_2$-$C_{60}$ alkynyl group, a substituted or unsubstituted $C_3$-$C_{10}$ cycloalkyl group, a substituted or unsubstituted $C_2$-$C_{10}$ heterocycloalkyl group, a substituted or unsubstituted $C_3$-$C_{10}$ cycloalkenyl group, a substituted or unsubstituted $C_2$-$C_{10}$ heterocycloalkenyl group, a substituted or unsubstituted $C_6$-$C_{30}$ aryl group, or a substituted or unsubstituted $C_2$-$C_{30}$ heteroaryl group.

$Z_1$ may be an electron transporting group and may be a substituted or unsubstituted $C_2$-$C_{10}$ heterocycloalkyl group, a substituted or unsubstituted $C_2$-$C_{10}$ heterocycloalkenyl group, or a substituted or unsubstituted $C_2$-$C_{60}$ heteroaryl group.

$R_1$ and $R_2$ may each independently be a hydrogen atom, a deuterium atom, a halogen atom, a hydroxyl group, a cyano group, a nitro group, an amino group, an amidino group, a hydrazine, a hydrazone, a carboxylic acid group or a salt thereof, a sulfonic acid group or a salt thereof, a phosphoric acid group or a salt thereof, a substituted or unsubstituted $C_1$-$C_{60}$ alkyl group, a substituted or unsubstituted $C_2$-$C_{60}$ alkenyl group, a substituted or unsubstituted $C_2$-$C_{60}$ alkynyl group, a substituted or unsubstituted $C_1$-$C_{60}$ alkoxy group, a substituted or unsubstituted $C_3$-$C_{10}$ cycloalkyl group, a substituted or unsubstituted $C_2$-$C_{10}$ heterocycloalkyl group, a substituted or unsubstituted $C_3$-$C_{10}$ cycloalkenyl group, a substituted or unsubstituted $C_2$-$C_{10}$ heterocycloalkenyl group, a substituted or unsubstituted $C_6$-$C_{60}$ aryl group, a substituted or unsubstituted $C_6$-$C_{60}$ aryloxy group, a substituted or unsubstituted $C_6$-$C_{60}$ arylthio group, or a substituted or unsubstituted $C_2$-$C_{60}$ heteroaryl group.

a1 and a2 may each independently be an integer from 0 to 9. If a1 is an integer of 2 or more, the 2 or more $R_1$ groups may be the same or different, and if a2 is an integer of 2 or more, the 2 or more $R_2$ groups may be the same or different.

b1 and b2 may each independently be an integer of 1 or 2.

According to an embodiment of the present invention, in Formulas 1 and 2, $X_1$ and $X_2$ may each independently be a substituted or unsubstituted $C_3$-$C_{10}$ cycloalkylene group, a substituted or unsubstituted $C_2$-$C_{10}$ heterocycloalkylene group, a substituted or unsubstituted $C_3$-$C_{10}$ cycloalkenylene group, a substituted or unsubstituted $C_2$-$C_{10}$ heterocycloalkenylene group, a substituted or unsubstituted $C_6$-$C_{60}$ arylene group, or a substituted or unsubstituted $C_2$-$C_{60}$ heteroarylene group, but $X_1$ and $X_2$ are not limited thereto.

For example, in Formulas 1 and 2, $X_1$ and $X_2$ may each independently be a substituted or unsubstituted phenylene group, a substituted or unsubstituted pentalenylene group, a substituted or unsubstituted indenylene group, a substituted or unsubstituted naphthylene group, a substituted or unsubstituted azulenylene group, a substituted or unsubstituted heptalenylene group, a substituted or unsubstituted indacenylene group, a substituted or unsubstituted acenaphthylene group, a substituted or unsubstituted fluorenylene group, a substituted or unsubstituted spiro-fluorenylene group, a substituted or unsubstituted phenalenylene group, a substituted or unsubstituted phenanthrenylene group, a substituted or unsubstituted anthrylene group, a substituted or unsubstituted fluoranthenylene group, a substituted or unsubstituted triphenylenylene group, a substituted or unsubstituted pyrenylene group, a substituted or unsubstituted chrysenylene group, a substituted or unsubstituted naphthacenylene group, a substituted or unsubstituted picenylene group, a substituted or unsubstituted perylenylene group, a substituted or unsubstituted pentaphenylene group, a substituted or unsubstituted hexacenylene group, a substituted or unsubstituted pyrrolylene group, a substituted or unsubstituted imidazolylene group, a substituted or unsubstituted pyrazolylene group, a substituted or unsubstituted pyridinylene group, a substituted or unsubstituted pyrazinylene group, a substituted or unsubstituted pyrimidinylene group, a substituted or unsubstituted pyridazinylene group, a substituted or unsubstituted isoindolylene group, a substituted or unsubstituted indolylene group, a substituted or unsubstituted indazolylene group, a substituted or unsubstituted purinylene group, a substituted or unsubstituted quinolinylene group, a substituted or unsubstituted benzoquinolinylene group, a substituted or unsubstituted phthalazinylene group, a substituted or unsubstituted naphthyridinylene group, a substituted or unsubstituted quinoxalinylene group, a substituted or unsubstituted quinazolinylene group, a substituted or unsubstituted cinnolinylene group, a substituted or unsubstituted carbazolylene group, a substituted or unsubstituted phenanthridinylene group, a substituted or unsubstituted acridinylene group, a substituted or unsubstituted phenanthrolinylene group, a substituted or unsubstituted phenazinylene group, a substituted or unsubstituted benzooxazolylene group, a substituted or unsubstituted benzoimidazolylene group, a substituted or unsubstituted furanylene group, a substituted or unsubstituted benzofuranylene group, a substituted or unsubstituted thiophenylene group, a substituted or unsubstituted benzothiophenylene group, a substituted or unsubstituted thiazolylene group, a substituted or unsubstituted isothiazolylene group, a substituted or unsubstituted benzothiazolylene group, a substituted or unsubstituted isoxazolylene group, a substituted or unsubstituted oxazolylene group, a substituted or unsubstituted triazolylene group, a substituted or unsubstituted tetrazolylene group, a substituted or unsubstituted oxadiazolylene group, a substituted or unsubstituted triazinylene group, a substituted or unsubstituted benzooxazolylene group, a substituted or unsubstituted dibenzopuranylene group, a substituted or unsubstituted dibenzothiophenylene group, or a substituted or unsubstituted benzocarbazolylene group, but $X_1$ and $X_2$ are not limited thereto.

For example, in Formulas 1 and 2, $X_1$ and $X_2$ may each independently be i) a phenylene group, a naphthylene group, an anthracenylene group, or a fluorenylene group; or ii) a phenylene group, a naphthylene group, an anthracenylene group, or a fluorenylene group substituted with at least one of a deuterium atom, a halogen atom, a hydroxyl group, a cyano group, a nitro group, an amino group, an amidino group, a hydrazine, a hydrazone, a carboxylic acid group or a salt thereof, a sulfonic acid group or a salt thereof, a phosphoric acid group or a salt thereof, and a $C_1$-$C_{10}$ alkyl group; a $C_1$-$C_{10}$ alkyl group substituted with at least one of a deuterium atom, a halogen atom, a hydroxyl group, a cyano group, a nitro group, an amino group, an amidino group, a hydrazine, a hydrazone, a carboxylic acid group or a salt thereof, a sulfonic acid group or a salt thereof, or a phosphoric acid group or a salt thereof; a $C_6$-$C_{16}$ aryl group or a $C_2$-$C_{16}$ heteroaryl group; or a $C_6$-$C_{16}$ aryl group or a $C_2$-$C_{16}$ heteroaryl group substituted with at least one of a deuterium atom, a halogen atom, a hydroxyl group, a cyano group, a nitro group, an amino group, an amidino group, a hydrazine, a hydrazone, a carboxylic acid group or a salt thereof, a sulfonic acid or a salt thereof, a phosphoric acid or a salt thereof, a $C_1$-$C_{60}$ alkyl group, a $C_2$-$C_{60}$ alkenyl group, a $C_2$-$C_{60}$ alkynyl group, a $C_1$-$C_{60}$ alkoxy group, a $C_6$-$C_{16}$ aryl group, or $C_2$-$C_{16}$ heteroaryl group, but $X_1$ and $X_2$ are not limited thereto.

For example, in Formulas 1 and 2, $X_1$ and $X_2$ may each independently be i) a phenylene group, a naphthylene group, or an anthracenylene group; ii) a phenylene group, a naphthylene group, or an anthracenylene group substituted with at least one of a deuterium atom, —F, a cyano group, a nitro group, a methyl group, an ethyl group, an n-propyl group, an iso-propyl group, an n-butyl group, an iso-butyl group, or a tert-butyl group; iii) a phenylene group, a naphthylene group, or an anthracenylene group substituted with at least one of a methyl group, an ethyl group, an n-propyl group, an iso-propyl group, an n-butyl group, an iso-butyl group, or a tert-butyl group substituted with at least one of a deuterium atom, —F, a cyano group, a nitro group, a methyl group, an ethyl group, an n-propyl group, an iso-propyl group, an n-butyl group, an iso-butyl group, or a tert-butyl group; iv) a phenylene group, a naphthylene group, or an anthracenylene group substituted with at least one of a phenyl group, a naphthyl group, an anthracenyl group, or a fluorenyl group; or v) a phenylene group or a naphthylene group substituted with at least one of a phenyl group, a naphthyl group, an anthracenyl group, or a fluorenyl group substituted with at least one of a deuterium atom, —F, a cyano group, a nitro group, a methyl group, an ethyl group, an n-propyl group, an iso-propyl group, an n-butyl group, an iso-butyl group, a tert-butyl group, a pyrrolyl group, an imidazolyl group, a triazolyl group, an isoindolyl group, an indolyl group, an indazolyl group, a pyrazolyl group, a purinyl group, a benzoimidazolyl group, an oxazolyl group, an isoxazolyl group, an oxadiazolyl group, or a benzoxazolyl group, but $X_1$ and $X_2$ are not limited thereto.

For example, in Formulas 1 and 2, $X_1$ and $X_2$ may each independently be a group represented by Formula 4a below, but $X_1$ and $X_2$ are not limited thereto:

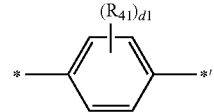

<Formula 4a>

In Formula 4a, $R_{41}$ may be selected from a hydrogen atom, a deuterium atom, —F, a cyano group, a methyl group, an ethyl group, an n-propyl group, an iso-propyl group, an n-butyl group, an iso-butyl group, or a tert-butyl group.

d1 may be integer of 0 to 4. If d1 is an integer of 2 or more, the 2 or more $R_{41}$ groups may be the same or different.

* is a bonding site to an anthracene ring, and *' is a bonding site to N or Z.

According to an embodiment of the present invention, in Formulas 1 and 2, n1 and n2 represent the numbers of $X_1$ groups and $X_2$ groups, respectively. Each of n1 and n2 may independently be an integer of 0 to 5. If n1 is an integer of 2 or more, the 2 or more $X_1$ groups may be the same or different, and if n2 is an integer of 2 or more, the 2 or more $X_2$ groups may be the same or different, but n1 and n2 are not limited thereto.

For example, in Formulas 1 and 2, n1 and n2 may each independently be 1, but n1 and n2 are not limited thereto.

According to an embodiment of the present invention, in Formula 1, $Y_1$ and $Y_2$ may each independently be a hydrogen atom, a deuterium atom, a halogen atom, a hydroxyl group, a cyano group, a nitro group, an amino group, an amidino group, a hydrazine, a hydrazone, a carboxylic acid group or a salt thereof, a sulfonic acid group or a salt thereof, a phosphoric acid group or a salt thereof, a substituted or unsubstituted $C_1$-$C_{30}$ alkyl group, a substituted or unsubstituted $C_2$-$C_{60}$ alkenyl group, a substituted or unsubstituted $C_2$-$C_{60}$ alkynyl group, a substituted or unsubstituted $C_3$-$C_{10}$ cycloalkyl group, a substituted or unsubstituted $C_2$-$C_{10}$ heterocycloalkyl group, a substituted or unsubstituted $C_3$-$C_{10}$ cycloalkenyl group, a substituted or unsubstituted $C_2$-$C_{10}$ heterocycloalkenyl group, a substituted or unsubstituted $C_6$-$C_{30}$ aryl group, or a substituted or unsubstituted $C_2$-$C_{30}$ heteroaryl group, but $Y_1$ and $Y_2$ are not limited thereto.

For example, in Formula 1, $Y_1$ and $Y_2$ may each independently be a substituted or unsubstituted phenyl group, a substituted or unsubstituted pentalenyl group, a substituted or unsubstituted indenyl group, a substituted or unsubstituted naphthyl group, a substituted or unsubstituted azulenyl group, a substituted or unsubstituted heptalenyl group, a substituted or unsubstituted indacenyl group, a substituted or unsubstituted acenaphthyl group, a substituted or unsubstituted fluorenyl group, a substituted or unsubstituted phenalenyl group, a substituted or unsubstituted phenanthrenyl group, a substituted or unsubstituted anthryl group, a substituted or unsubstituted fluoranthenyl group, a substituted or unsubstituted triphenylenyl group, a substituted or unsubstituted pyrenyl group, a substituted or unsubstituted chrysenyl group, a substituted or unsubstituted naphthacenyl group, a substituted or unsubstituted picenyl group, a substituted or unsubstituted perylenyl group, a substituted or unsubstituted pentaphenyl group, a substituted or unsubstituted hexacenyl group, a substituted or unsubstituted pyrrolyl group, a substituted or unsubstituted imidazolyl group, a substituted or unsubstituted pyrazolyl group, a substituted or unsubstituted pyridinyl group, a substituted or unsubstituted pyrazinyl group, a substituted or unsubstituted pyrimidinyl group, a substituted or unsubstituted pyridazinyl group, a substituted or unsubstituted isoindolyl group, a substituted or unsubstituted indolyl group, a substituted or unsubstituted indazolyl group, a substituted or unsubstituted purinyl group, a substituted or unsubstituted quinolinyl group, a substituted or unsubstituted benzoquinolinyl group, a substituted or unsubstituted phthalazinyl group, a substituted or unsubstituted naphthyridinyl group, a substituted or unsubstituted quinoxalinyl group, a substituted or unsubstituted quinazolinyl group, a substituted or unsubstituted cinnolinyl group, a substituted or unsubstituted carbazolyl group, a substituted or unsubstituted phenanthridinyl group, a substituted or unsubstituted acridinyl group, a substituted or unsubstituted phenanthrolinyl group, a substituted or unsubstituted phenazinyl group, a substituted or unsubstituted benzoimidazolyl group, a substituted or unsubstituted furanyl group, a substituted or unsubstituted benzofuranyl group, a substituted or unsubstituted thiophenyl group, a substituted or unsubstituted benzothiophenyl group, a substituted or unsubstituted thiazolyl group, a substituted or unsubstituted isothiazolyl group, a substituted or unsubstituted benzothiazolyl group, a substituted or unsubstituted isoxazolyl group, a substituted or unsubstituted oxazolyl group, a substituted or unsubstituted triazolyl group, a substituted or unsubstituted tetrazolyl group, a substituted or unsubstituted oxadiazolyl group, a substituted or unsubstituted triazinyl group, a substituted or unsubstituted benzoxazolyl group, a substituted or unsubstituted dibenzopuranyl group, a substituted or unsubstituted dibenzothiophenyl group, or a substituted or unsubstituted benzocarbazolyl group, but $Y_1$ and $Y_2$ are not limited thereto.

For example, in Formula 1, $Y_1$ and $Y_2$ may each independently be i) a phenyl group, a naphthyl group, an anthryl group, a fluorenyl group, a furanyl group, a benzofuranyl group, or a dibenzofuranyl group; or ii) a phenyl group, a naphthyl group, an anthryl group, a fluorenyl group, a furanyl group, a benzofuranyl group, or a dibenzofuranyl group substituted with at least one of a deuterium atom, a halogen atom, a hydroxyl group, a cyano group, a nitro group, an amino group, an amidino group, a hydrazine, a hydrazone, a carboxylic acid group or a salt thereof, a sulfonic acid group or a salt thereof, or a phosphoric acid group or a salt thereof, or $C_1$-$C_{10}$ alkyl group; a $C_1$-$C_{10}$ alkyl group substituted with at least one of a deuterium atom, a halogen atom, a hydroxyl group, a cyano group, a nitro group, an amino group, an amidino group, a hydrazine, a hydrazone, a carboxylic acid group or a salt thereof, a sulfonic acid group or a salt thereof, a phosphoric acid group or a salt thereof; a $C_6$-$C_{16}$ aryl group, or a $C_2$-$C_{16}$ heteroaryl group; or a $C_6$-$C_{16}$ aryl group or a $C_2$-$C_{16}$ heteroaryl group substituted with at least one of a deuterium atom, a halogen atom, a hydroxyl group, a cyano group, a nitro group, an amino group, an amidino group, a hydrazine, a hydrazone, a carboxylic acid group or a salt thereof, a sulfonic acid or a salt thereof, a phosphoric acid or a salt thereof, a $C_1$-$C_{60}$ alkyl group, a $C_2$-$C_{60}$ alkenyl group, a $C_2$-$C_{60}$ alkynyl group, a $C_1$-$C_{60}$ alkoxy group, a $C_6$-$C_{16}$ aryl group, or a $C_2$-$C_{16}$ heteroaryl group, but $Y_1$ and $Y_2$ are not limited thereto.

For example, in Formula 1, $Y_1$ and $Y_2$ may each independently be i) a phenyl group, a naphthyl group, an anthryl group, a fluorenyl group, a furanyl group, a benzofuranyl group, or a dibenzofuranyl group; ii) a phenyl group, a naphthyl group, an anthryl group, a fluorenyl group, a furanyl group, a benzofuranyl group, or a dibenzofuranyl group substituted with at least one of a deuterium atom, —F, a cyano group, a nitro group, a methyl group, an ethyl group, an n-propyl group, an iso-propyl group, an n-butyl group, an iso-butyl group, or a tert-butyl group; iii) a phenyl group, a naphthyl group, an anthryl group, a fluorenyl group, a furanyl group, a benzofuranyl group, or a dibenzofuranyl group substituted with at least one of a phenyl group, a naphthyl group, an anthracenyl group, or a fluorenyl group; or iv) a phenyl group, a naphthyl group, an anthryl group, a fluorenyl group, a furanyl group, a benzofuranyl group, or a dibenzofuranyl group substituted with at least one of a phenyl group, a naphthyl group, an anthracenyl group, or a fluorenyl group substituted with at least one of a deuterium atom, —F, a cyano group, a nitro group, a methyl group, an ethyl group, an n-propyl group, an iso-propyl group, an n-butyl group, an iso-butyl group, a tert-butyl group, a pyrrolyl group, a imidazolyl group, a pyrazolyl group, a triazolyl group, an isoindolyl group, an indolyl group, an indazolyl group, a purinyl group, a benzoimidazolyl group, an oxazolyl group, an isoxazolyl group, an oxadiazolyl group, or a benzoxazolyl group, but $Y_1$ and $Y_2$ are not limited thereto.

For example, in Formula 1, $Y_1$ and $Y_2$ may each independently be i) a phenyl group, a fluorenyl group, or a dibenzofuranyl group; ii) a phenyl group, a fluorenyl group, or a dibenzofuranyl group substituted with at least one of a deuterium atom, —F, a cyano group, a nitro group, a methyl group, an ethyl group, an n-propyl group, an iso-propyl group, an n-butyl group, or an iso-butyl group; or iii) a phenyl group, a fluorenyl group, or a dibenzofuranyl group substituted with at least one of a phenyl group, a naphthyl group, an anthracenyl group, or a fluorenyl group, but $Y_1$ and $Y_2$ are not limited thereto.

For example, in Formula 1, $Y_1$ and $Y_2$ may each independently be at least one group represented by one of Formulas 5a to 5e below, but $Y_1$ and $Y_2$ are not limited thereto:

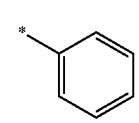

<Formula 5a>

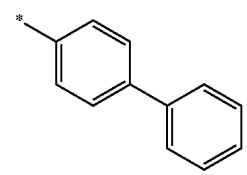

<Formula 5b>

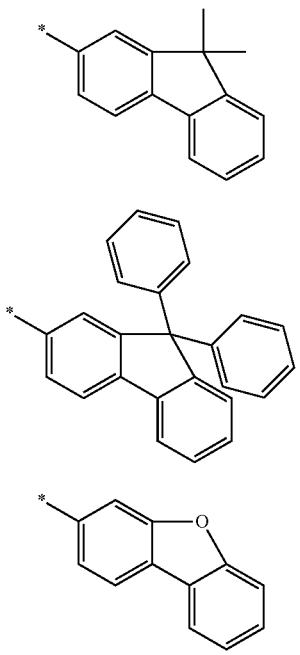

<Formula 5c>

<Formula 5d>

<Formula 5e>

In Formulas 5a to 5e, * is a bonding site to N.

According to an embodiment of the present invention, in Formula 2, $Z_1$ may be a substituted or unsubstituted $C_2$-$C_{10}$ heterocycloalkyl group, a substituted or unsubstituted $C_2$-$C_{10}$ heterocycloalkenyl group, or a substituted or unsubstituted $C_2$-$C_{60}$ heteroaryl group, but $Z_1$ is not limited thereto.

For example, in Formula 2, $Z_1$ may be an electron transporting group and may be a substituted or unsubstituted pyrrolyl group, a substituted or unsubstituted imidazolyl group, a substituted or unsubstituted pyrazolyl group, a substituted or unsubstituted triazolyl group, a substituted or unsubstituted pyridinyl group, a substituted or unsubstituted pyrazinyl group, a substituted or unsubstituted pyrimidinyl group, a substituted or unsubstituted pyridazinyl group, a substituted or unsubstituted triazinyl group, a substituted or unsubstituted isoindolyl group, a substituted or unsubstituted indolyl group, a substituted or unsubstituted indazolyl group, a substituted or unsubstituted purinyl group, a substituted or unsubstituted quinolinyl group, a substituted or unsubstituted benzoquinolinyl group, a substituted or unsubstituted phthalazinyl group, a substituted or unsubstituted naphthyridinyl group, a substituted or unsubstituted quinoxalinyl group, a substituted or unsubstituted quinazolinyl group, a substituted or unsubstituted cinnolinyl group, a substituted or unsubstituted carbazolyl group, a substituted or unsubstituted phenanthridinyl group, a substituted or unsubstituted acridinyl group, a substituted or unsubstituted phenanthrolinyl group, a substituted or unsubstituted acridinyl group, a substituted or unsubstituted phenanthrolinyl group, a substituted or unsubstituted phenazinyl group, a substituted or unsubstituted benzoimidazolyl group, a substituted or unsubstituted oxazolyl group, a substituted or unsubstituted isoxazolyl group, a substituted or unsubstituted oxadiazolyl group, a substituted or unsubstituted benzooxazolyl group, or a substituted or unsubstituted benzocarbazolyl group, but $Z_1$ is not limited thereto.

For example, in Formula 2, $Z_1$ may be i) a pyrrolyl group, an imidazolyl group, a pyrazolyl group, a triazolyl group, an isoindolyl group, an indolyl group, an indazolyl group, a purinyl group, a benzoimidazolyl group, an oxazolyl group, an isooxazolyl group, an oxadiazolyl group, or a benzoxazolyl group; or ii) a pyrrolyl group, an imidazolyl group, a pyrazolyl group, a triazolyl group, an isoindolyl group, an indolyl group, an indazolyl group, a purinyl group, a benzoimidazolyl group, an oxazolyl group, an isooxazolyl group, an oxadiazolyl group, or a benzoxazolyl group substituted with at least one of a deuterium atom, a halogen atom, a hydroxyl group, a cyano group, a nitro group, an amino group, an amidino group, a hydrazine, a hydrazone, a carboxylic acid group or a salt thereof, a sulfonic acid group or a salt thereof, a phosphoric acid group or a salt thereof, or a $C_1$-$C_{10}$ alkyl group; a $C_1$-$C_{10}$ alkyl group substituted with at least one of a deuterium atom, a halogen atom, a hydroxyl group, a cyano group, a nitro group, an amino group, an amidino group, a hydrazine, a hydrazone, a carboxylic acid group or a salt thereof, a sulfonic acid group or a salt thereof, or a phosphoric acid group or a salt thereof; a $C_6$-$C_{16}$ aryl group or a $C_2$-$C_{16}$ heteroaryl group; or a $C_6$-$C_{16}$ aryl group or a $C_2$-$C_{16}$ heteroaryl group substituted with at least one of a deuterium atom, a halogen atom, a hydroxyl group, a cyano group, a nitro group, an amino group, an amidino group, a hydrazine, a hydrazone, a carboxylic acid group or a salt thereof, a sulfonic acid group or a salt thereof, a phosphoric acid group or a salt thereof, a $C_1$-$C_{60}$ alkyl group, a $C_2$-$C_{60}$ alkenyl group, a $C_2$-$C_{60}$ alkynyl group, a $C_1$-$C_{60}$ alkoxy group, a $C_6$-$C_{16}$ aryl group, or a $C_2$-$C_{16}$ heteroaryl group, but $Z_1$ is not limited thereto.

For example, in Formula 2, $Z_1$ may be i) an oxazolyl group, an isoxazolyl group, or an oxadiazolyl group; ii) an oxazolyl group or an isoxazolyl group substituted with at least one of a deuterium atom, —F, a cyano group, a nitro group, a methyl group, an ethyl group, an n-propyl group, an iso-propyl group, an n-butyl group, an iso-butyl group, or a tert-butyl group; iii) an oxazolyl group or an isoxazolyl group substituted with at least one of a phenyl group, a naphthyl group, an anthracenyl group, a pyrrolyl group, an imidazolyl group, a pyrazolyl group, or a triazoly group; or iv) an oxazolyl group or an isoxazolyl group substituted with at least one of a phenyl group, a naphthyl group, an anthracenyl group, a pyrrolyl group, an imidazolyl group, a pyrazolyl group, or a triazolyl group substituted with a deuterium atom, —F, a cyano group, a nitro group, a methyl group, an ethyl group, an n-propyl group, an iso-propyl group, an n-butyl group, an iso-butyl group, tert-butyl group, a phenyl group, a naphthyl group, or anthracenyl group, but $Z_1$ is not limited thereto.

For example, in Formula 2, $Z_1$ may be at least one group represented by one of Formulas 3a to 3e below, but $Z_1$ is not limited thereto:

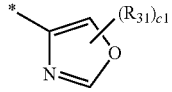

<Formula 3a>

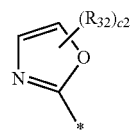

<Formula 3b>

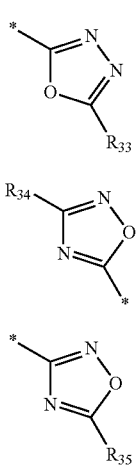

<Formula 3c>

<Formula 3d>

<Formula 3e>

In Formulas 3a to 3e, $R_{31}$ to $R_{35}$ may each independently be a hydrogen atom, a deuterium atom, —F, a cyano group, a methyl group, an ethyl group, a phenyl group, a biphenyl group, or a naphthyl group. c1 and c2 may each independently be an integer of 0 to 4. If c1 is an integer of 2 or more, the 2 or more $R_{31}$ groups may be the same or different, and if c2 is an integer of 2 or more, the 2 or more $R_{32}$ groups may be the same or different. * is a bonding site to $X_2$.

According to an embodiment of the present invention, in Formulas 1 and 2, $R_1$ and $R_2$ may each independently be a hydrogen atom, a deuterium atom, a halogen atom, a hydroxyl group, a cyano group, a nitro group, an amino group, an amidino group, a hydrazine, a hydrazone, a carboxylic acid group or a salt thereof, a sulfonic acid group or a salt thereof, a phosphoric acid group or a salt thereof, a substituted or unsubstituted $C_1$-$C_{60}$ alkyl group, a substituted or unsubstituted $C_2$-$C_{60}$ alkenyl group, a substituted or unsubstituted $C_2$-$C_{60}$ alkynyl group, a substituted or unsubstituted $C_1$-$C_{60}$ alkoxy group, a substituted or unsubstituted $C_3$-$C_{10}$ cycloalkyl group, a substituted or unsubstituted $C_2$-$C_{10}$ heterocycloalkyl group, a substituted or unsubstituted $C_3$-$C_{10}$ cycloalkenyl group, a substituted or unsubstituted $C_2$-$C_{10}$ heterocycloalkenyl group, a substituted or unsubstituted $C_6$-$C_{60}$ aryl group, a substituted or unsubstituted $C_6$-$C_{60}$ aryloxy group, a substituted or unsubstituted $C_6$-$C_{60}$ arylthio group, or a substituted or unsubstituted $C_2$-$C_{60}$ heteroaryl group, but $R_1$ and $R_2$ are not limited thereto.

For example, in Formulas 1 and 2, $R_1$ and $R_2$ may each independently be selected from a deuterium atom, a halogen atom, a hydroxyl group, a cyano group, a nitro group, or a $C_1$-$C_{10}$ alkyl group; a $C_1$-$C_{10}$ alkyl group substituted with at least one of a deuterium atom, a halogen atom, a hydroxyl group, a cyano group, a nitro group, an amino group, an amidino group, a hydrazine, a hydrazone, a carboxylic acid group or a salt thereof, a sulfonic acid group or a salt thereof, or a phosphoric acid group or a salt thereof; a $C_6$-$C_{16}$ aryl group; or a $C_6$-$C_{16}$ aryl group substituted with at least one of a deuterium atom, a halogen atom, a hydroxyl group, a cyano group, a nitro group, an amino group, an amidino group, a hydrazine, a hydrazone, a carboxylic acid group or a salt thereof, a sulfonic acid group or a salt thereof, a phosphoric acid group or a salt thereof, a $C_1$-$C_{10}$ alkyl group, a $C_1$-$C_{10}$ alkoxy group, a phenyl group, a naphthyl group, or an anthryl group, but $R_1$ and $R_2$ are not limited thereto.

For example, in Formulas 1 and 2, $R_1$ and $R_2$ may each independently be a hydrogen atom, a deuterium atom, —F, a cyano group, a nitro group, a methyl group, an ethyl group, an n-propyl group, an iso-propyl group, an n-butyl group, an iso-butyl group, or a tert-butyl group; a methyl group, an ethyl group, an n-propyl group, an iso-propyl group, an n-butyl group, an iso-butyl group, or a tert-butyl group substituted with at least one of a hydrogen atom, a deuterium atom, —F, a cyano group, a nitro group, a methyl group, an ethyl group, an n-propyl group, an iso-propyl group, an n-butyl group, an iso-butyl group, or a tert-butyl group; a phenyl group, a naphthyl group, or an anthracenyl group; or a phenyl group, a naphthyl group, or an anthracenyl group substituted with at least one of a hydrogen atom, a deuterium atom, —F, a cyano group, a nitro group, a methyl group, an ethyl group, an n-propyl group, an iso-propyl group, an n-butyl group, an iso-butyl group, or a tert-butyl group, but $R_1$ and $R_2$ are not limited thereto.

For example, in Formulas 1 and 2, $R_1$ and $R_2$ may be the same, but are not limited thereto. In one embodiment, for example, $R_1$ and $R_2$ may both be hydrogen atoms.

According to an embodiment of the present invention, in Formulas 1 and 2, a1 and a2 represent the numbers $R_1$ groups and $R_2$ groups, respectively. a1 and a2 are each independently an integer of 0 to 4. If a1 is an integer of 2 or more, the 2 or more $R_1$ groups may be the same or different, and if a2 is an integer of 2 or more, the 2 or more $R_2$ groups may be the same or different, but a1 and a2 are not limited thereto.

For example, in Formula 1, a1 may be 0, but is not limited thereto.

For example, in Formula 2, a2 may be 0, but is not limited thereto.

According to an embodiment of the present invention, in Formulas 1 and 2, b1 represents the number of moieties represented by

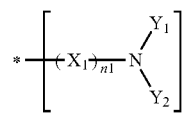

(where * is a bonding site to an anthracene ring), and b2 represents the number of moieties represented by

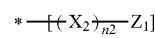

(where * is a bonding site to an anthracene ring). In Formulas 1 and 2, b1 and b2 may each independently be an integer of 1 or 2, but b1 and b2 are not limited thereto.

For example, in Formulas 1 and 2, b1 and b2 may each independently be 1, but b1 and b2 are not limited thereto.

According to an embodiment of the present invention, the amine-based compound may be represented by Formula 1a below, but is not limited thereto:

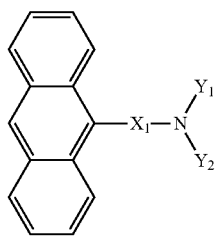

<Formula 1a>

In Formula 1a, $X_1$ may be a phenylene group; or a phenylene group substituted with at least one of a deuterium atom, —F, a cyano group, a nitro group, a methyl group, an ethyl group, an n-propyl group, an iso-propyl group, an n-butyl group, an iso-butyl group, a tert-butyl group, or a phenyl group.

$Y_1$ and $Y_2$ may each independently be i) a phenyl group, a fluorenyl group, or a dibenzofuranyl group; ii) a phenyl group, a fluorenyl group, or a dibenzofuranyl group substituted with at least one of a deuterium atom, —F, a cyano group, a nitro group, a methyl group, an ethyl group, an n-propyl group, an iso-propyl group, an n-butyl group, an iso-butyl group, or a tert-butyl group; iii) a phenyl group, a fluorenyl group, or a dibenzofuranyl group substituted with at least one of a methyl group, an ethyl group, an n-propyl group, an iso-propyl group, an n-butyl group, an iso-butyl group, or a tert-butyl group substituted with at least one of a deuterium atom, —F, a cyano group, or a nitro group; or iv) a phenyl group, a fluorenyl group, or a dibenzofuranyl group substituted with at least one of a phenyl group, a naphthyl group, an anthracenyl group, or a fluorenyl group.

According to an embodiment of the present invention, the anthracene-based compound may be represented by Formula 2a below, but is not limited thereto:

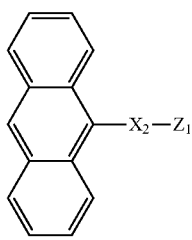

<Formula 2a>

In Formula 2a, $X_2$ may be a phenylene group; or a phenylene group substituted with at least one of a deuterium atom, —F, a cyano group, a nitro group, a methyl group, an ethyl group, an n-propyl group, an iso-propyl group, an n-butyl group, an iso-butyl group, a tert-butyl group, or a phenyl group.

$Z_1$ may be at least one group represented by one of Formulas 3a to 3e below, but is not limited thereto:

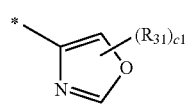

<Formula 3a>

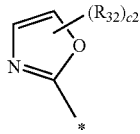

<Formula 3b>

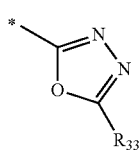

<Formula 3c>

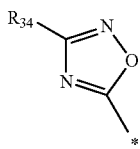

<Formula 3d>

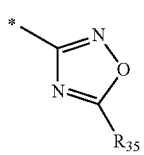

<Formula 3e>

In Formulas 3a to 3e, $R_{31}$ and $R_{35}$ may each independently be a hydrogen atom, a deuterium atom, —F, a cyano group, a methyl group, an ethyl group, a phenyl group, a biphenyl group, or a naphthyl group.

c1 and c2 may each independently be an integer of 0 to 4. If c1 is an integer of 2 or more, the 2 or more $R_{31}$ groups may be the same or different, and if c2 is an integer of 2 or more, the 2 or more $R_{32}$ groups may be the same or different.

* is a bonding site to $X_2$.

According to an embodiment of the present invention, the amine-based compound may be represented by Formula 1a below, and the anthracene-based compound may be represented by Formula 2a below, but the amine-based compound and anthracene-based compound are not limited thereto:

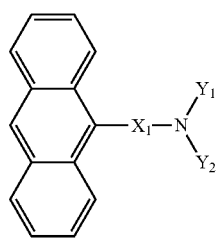

<Formula 1a>

In Formula 1a, $X_1$ may be a phenylene group; or a phenylene group substituted with a deuterium atom, —F, a cyano group, a nitro group, a methyl group, an ethyl group, an n-propyl group, an iso-propyl group, an n-butyl group, an iso-butyl group, a tert-butyl group, or a phenyl group.

$Y_1$ and $Y_2$ may each independently be i) a phenyl group, a fluorenyl group, or a dibenzofuranyl group; ii) a phenyl group, a fluorenyl group, or a dibenzofuranyl group substituted with at least one of a deuterium atom, —F, a cyano group, a nitro group, a methyl group, an ethyl group, an n-propyl group, an iso-propyl group, an n-butyl group, an iso-butyl group, or a tert-butyl group; iii) a phenyl group, a fluorenyl group, or a dibenzofuranyl group substituted with at least one of a methyl group, an ethyl group, an n-propyl group, an iso-propyl group, an n-butyl group, an iso-butyl group, or a tert-butyl group substituted with at least one of a deuterium atom, —F, a cyano group, or a nitro group; or iv) a phenyl group, a fluorenyl group, or a dibenzofuranyl group substituted with at least one of a phenyl group, a naphthyl group, an anthracenyl group, or a fluorenyl group.

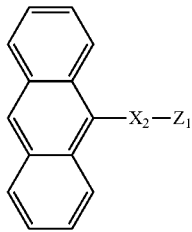

<Formula 2a>

In Formula 2a, $X_2$ may be a phenylene group; or a phenylene group substituted with at least one of a deuterium atom, —F, a cyano group, a nitro group, a methyl group, an ethyl group, an n-propyl group, an iso-propyl group, an n-butyl group, an iso-butyl group, a tert-butyl group, or a phenyl group.

$Z_1$ may be at least one group represented by one of Formulas 3a to 3e below.

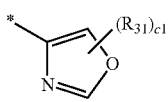

<Formula 3a>

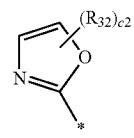

<Formula 3b>

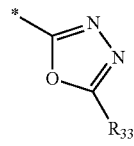

<Formula 3c>

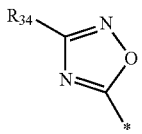

<Formula 3d>

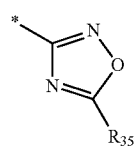

<Formula 3e>

In Formulas 3a to 3e, $R_{31}$ to $R_{35}$ may each independently be a hydrogen atom, a deuterium atom, —F, a cyano group, a methyl group, an ethyl group, a phenyl group, a biphenyl group, or a naphthyl group.

c1 and c2 may each independently be an integer of 0 to 4. If c1 is an integer of 2 or more, the 2 or more $R_{31}$ groups may be the same or different, and if c2 is an integer of 2 or more, the 2 or more $R_{32}$ groups may be the same or different.

\* is a bonding site to $X_2$.

According to an embodiment of the present invention, the amine-based compound may be one of Compounds 1 to 5 below, but is not limited thereto.

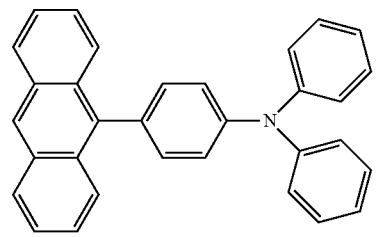

<Compound 1>

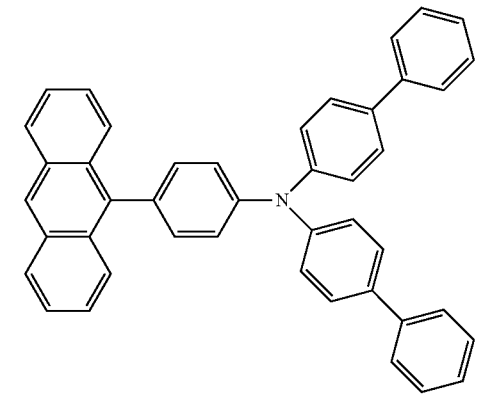

<Compound 2>

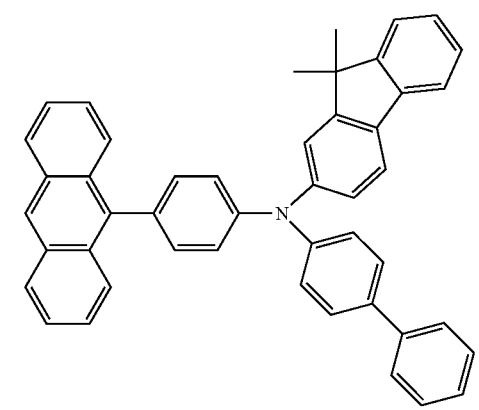

<Compound 3>

<Compound 4>
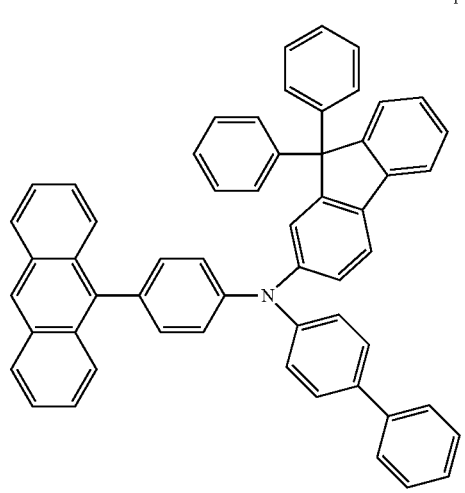
<Compound 7>
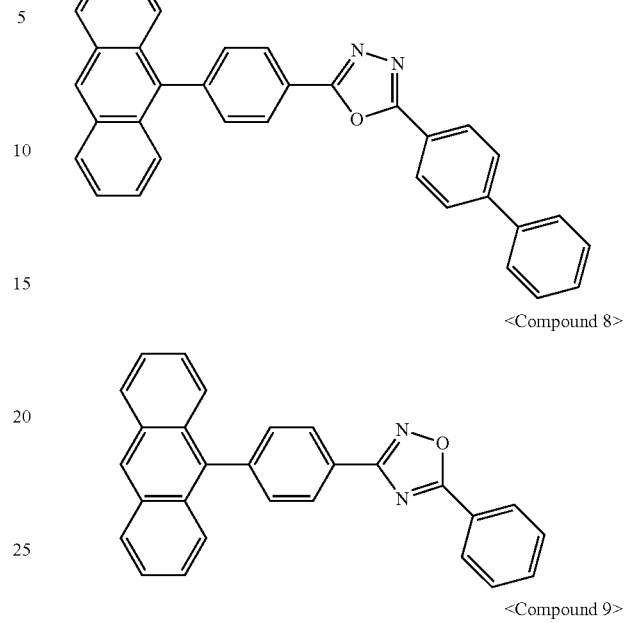
<Compound 5>
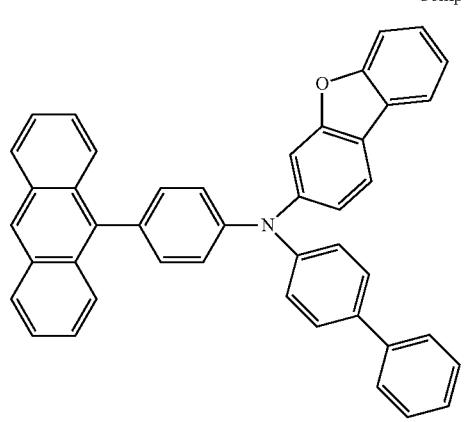
According to an embodiment of the present invention, the anthracene-based compound may be one of Compounds 6 to 11 below, but is not limited thereto.
<Compound 6>
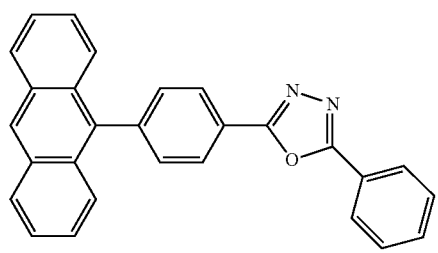
According to an embodiment of the present invention, the amine-based compound may be one of Compounds 1 to 5 below, and the anthracene-based compound may be one of Compounds 6 to 11 below, but the amine-based compound and the anthracene-based compound are not limited thereto.
<Compound 1>
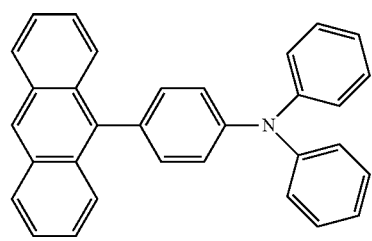
<Compound 2>
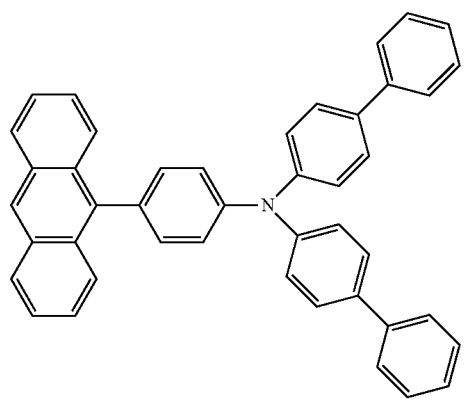
<Compound 3>
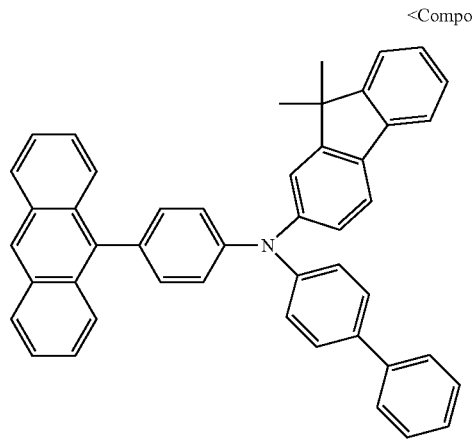
<Compound 4>
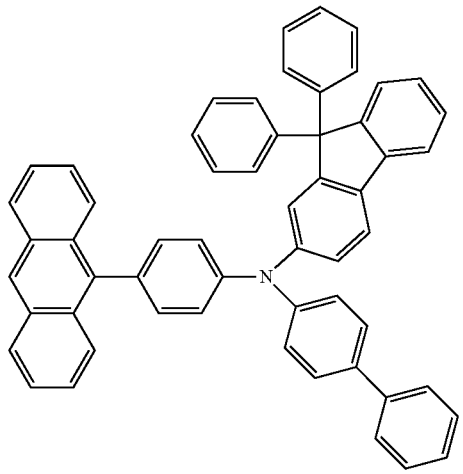
<Compound 5>
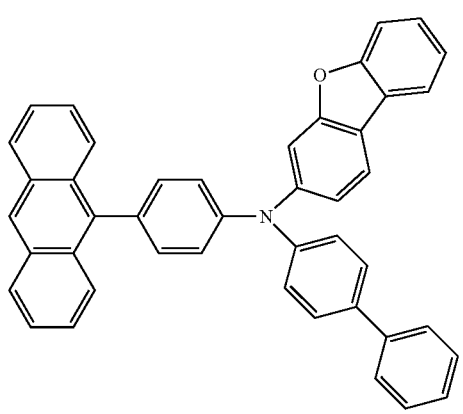
<Compound 6>
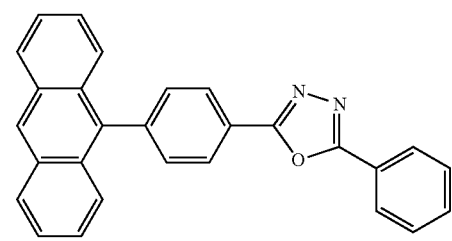
<Compound 7>
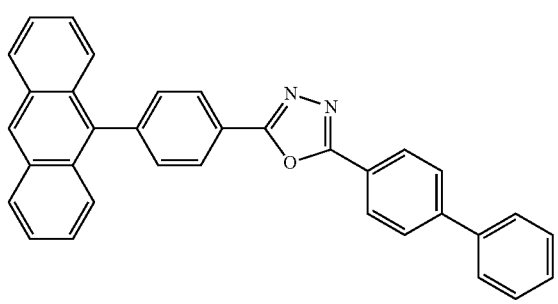

<Compound 8>
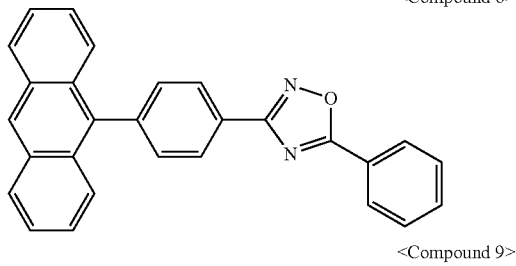

<Compound 9>
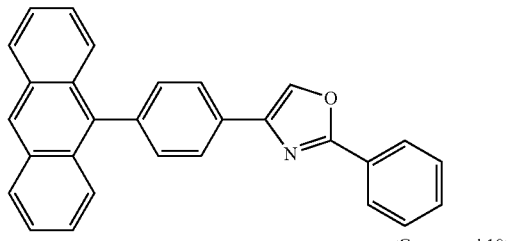

<Compound 10>
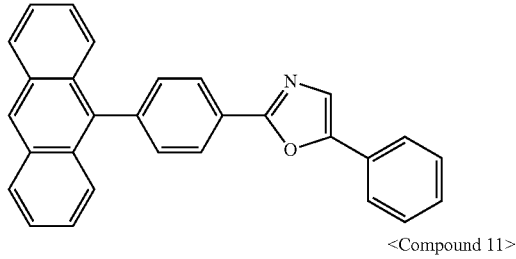

<Compound 11>
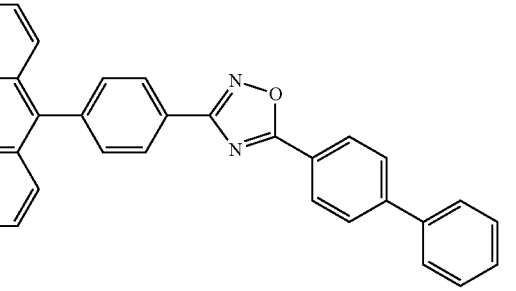

The amine-based compound represented by Formula 1 is a material having good hole transport ability. Also, the anthracene-based compound represented by Formula 2 is a material having good electron transport ability. Accordingly, by using both an amine-based compound having good hole transport ability and an anthracene-based compound having good electron transport ability in an organic layer, holes and electrons may efficiently form excitons, thus improving the efficiency of a diode. Also, the emission layer has both hole affinity and electron affinity without a bias towards one or the other, and therefore holes and electrons are well balanced in the emission layer, leading to improved lifespan of the diode.

The organic layer may include a hole transport region between the first electrode and the emission layer, and has at least one of a hole injection, a hole transport layer, a functional layer having both hole injection ability and hole transport ability (hereinafter referred as an 'H-functional layer'), a buffer layer, and/or an electron blocking layer. The organic layer may also have a hole transport region between the emission layer and the second electrode, and has at least one of a hole blocking layer, an electron transport layer, and/or an electron injection layer.

According to an embodiment of the present invention, the amine-based compound and the anthracene-based compound may be included in the emission layer, but the present invention is not limited thereto.

For example, the amine-based compound and the anthracene-based compound may be co-deposited, but the present invention is not limited thereto.

For example, the amine-based compound and the anthracene-based compound may be co-deposited in a weight ratio of about 5:1 to about 1:1, but the present invention is not limited thereto. When the ratio of co-deposition is within the above range, the OLED may have higher efficiency.

For example, the emission layer may include a first emission layer and a second emission layer, and the first emission layer may include the amine-based compound and the second emission layer may include the anthracene-based compound, but the present invention is not limited thereto.

For example, the first emission layer may be disposed between the second emission layer and the first electrode, but the present invention is not limited thereto.

FIG. 1 is a schematic view of a structure of an OLED 10 according to an embodiment of the present invention. Hereinafter, a structure and a method of manufacturing the OLED, according to an embodiment of the present invention, will be described with reference to FIG. 1.

A substrate 11 may be any substrate conventionally used in OLEDs. In some embodiments, the substrate 11 may be a glass substrate or a transparent plastic substrate with good mechanical strength, thermal stability, transparency, surface smoothness, ease of handling, and water resistance.

A first electrode 13 may be formed by depositing or sputtering a first electrode-forming material onto a surface of the substrate 11. When the first electrode 13 is an anode, a material having a high work function may be used as the first electrode-forming material to facilitate hole injection. The first electrode 13 may be a reflective electrode or a transmission electrode. Examples of the first electrode-forming material may be transparent and conductive materials such as indium tin oxide (ITO), indium zinc oxide (IZO), stannic oxide (SnO2), zinc oxide (ZnO), or the like. The first electrode 13 may be formed as a reflective electrode using magnesium (Mg), aluminum (Al), aluminum-lithium (Al—Li), calcium (Ca), magnesium-indium (Mg—In), magnesium-silver (Mg—Ag), or the like.

The first electrode 13 may have a single-layer structure or a multi-layer structure including at least two layers. For example, the first electrode 13 may have a three-layered structure of ITO/Ag/ITO, but is not limited thereto.

An organic layer 15 may be disposed on the first electrode 13.

The organic layer 15 may include a hole injection layer (HIL), a hole transport layer (HTL), an H-functional layer, a buffer layer, an emission layer (EML), an electron transport layer (ETL), and an electron injection layer (EIL).

The HIL may be formed on the first electrode 13 by vacuum deposition, spin coating, casting, Langmuir-Blodgett (LB) deposition, or the like. When the HIL is formed using vacuum deposition, the vacuum deposition conditions may vary depending on the compound used to form the HIL, and the desired structure and thermal properties of the HIL to be formed. For example, vacuum deposition may be performed at a temperature of about 100° C. to about 500° C., a pressure of about $10^{-8}$ torr to about $10^{-3}$ torr, and a deposition rate of about 0.01 Å/sec to about 100 Å/sec. However, the deposition conditions are not limited thereto.

When the HIL is formed using spin coating, the coating conditions may vary according to the compound that is used to form the HIL, and the desired structure and thermal properties of the HIL to be formed. For example, the coating rate may be in a range of about 2000 rpm to about 5000 rpm, and a temperature at which heat treatment is performed to remove solvent after coating may be in a range of about 80° C. to about 200° C. However, the coating conditions are not limited thereto.

The HIL may be formed of any material commonly used to form an HIL. Examples of the HIL-forming materials include N,N'-diphenyl-N,N'-bis-[4-(phenyl-m-tolyl-amino)-phenyl]-biphenyl-4,4'-diamine (DNTPD), a phthalocyanine compound such as copper phthalocyanine, 4,4',4"-tris (3-methylphenylphenylamino)triphenylamine (m-MTDATA), N,N'-di(1-naphthyl-N,N'-diphenylbenzidine (NPB), TDATA polyaniline/dodecylbenzenesulfonic acid (Pani/DBSA), poly (3,4-ethylenedioxythiophene)/poly(4-styrenesulfonate) (PEDOT/PSS), polyaniline/camphor sulfonic acid (PANI/CSA), or polyaniline/poly(4-styrenesulfonate) (Pani/PSS) below, but are not limited thereto.

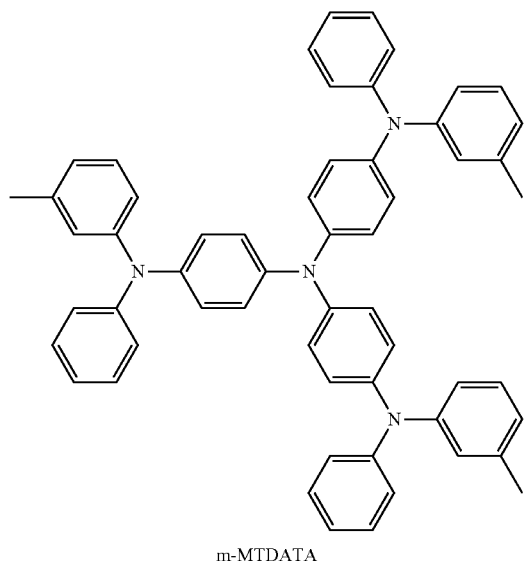

m-MTDATA

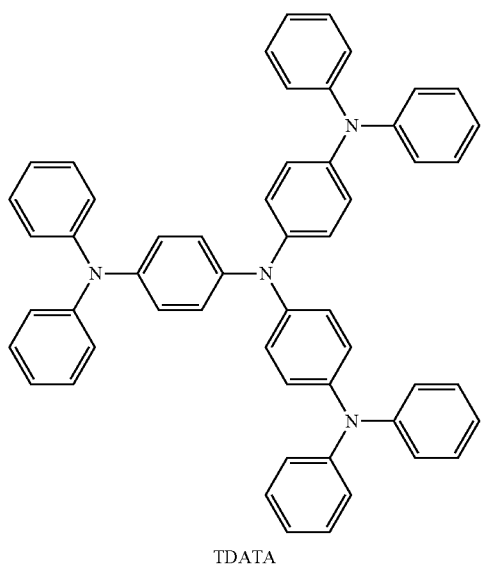

TDATA

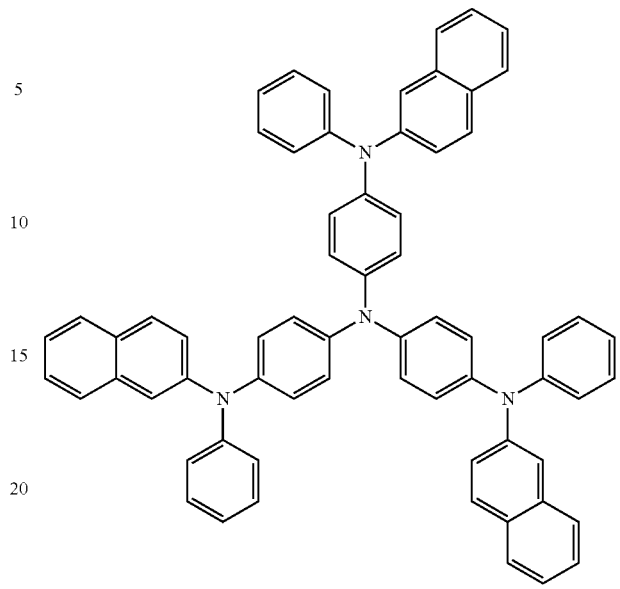

2-TNATA

Alternatively, the HIL may include at least one type of silicon-based compound.

A thickness of the HIL may be in a range of about 100 Å to about 10,000 Å, for example, about 100 Å to about 1,000 Å. When the thickness of the HIL is within the above ranges, the HIL may have good hole injection ability without a substantial increase in driving voltage.

Then, an HTL may be formed on the HIL by vacuum deposition, spin coating, casting, LB deposition, or the like. When the HTL is formed using vacuum deposition or spin coating, the conditions for deposition or coating may be similar to those for the formation of the HIL, though the conditions for the deposition or coating may vary depending on the compound used to form the HTL.

Examples of the HTL-forming materials may include carbazole derivatives such as N-phenylcarbazole or polyvinylcarbazole, N,N'-bis(3-methylphenyl-N,N'-diphenyl-[1,1-biphenyl]-4,4'-diamine (TPD), 4,4',4"-tris(N-carbazolyl triphenylamine (TCTA), and N,N'-di(1-naphthyl-N,N'-diphenylbenzidine) (NPB), but are not limited thereto. Alternatively, the HTL may include at least one type of silicon-based compound.

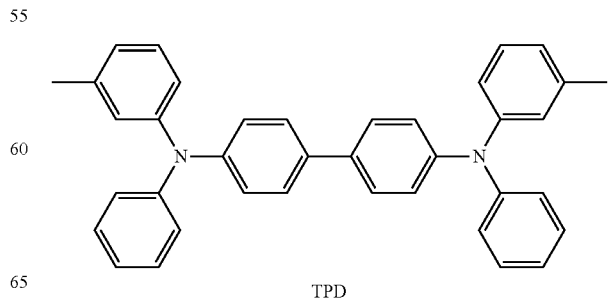

TPD

-continued

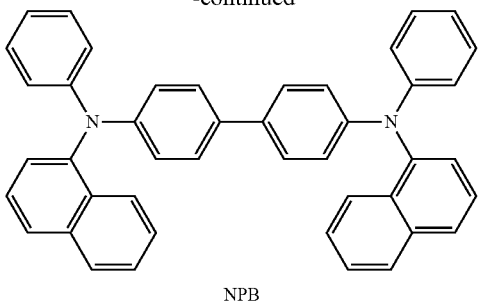

NPB

A thickness of the HTL may be in a range of about 50 Å to about 2,000 Å, for example, about 100 Å to about 1,500 Å. When the thickness of the HTL is within the above ranges, the HTL may have good hole transport ability without a substantial increase in driving voltage.

The H-functional layer (having both hole injection and hole transport capabilities) may include at least one hole injecting material and at least one hole transporting material. A thickness of the H-functional layer may be in a range of about 500 Å to about 10,000 Å, for example, about 100 Å to about 1,000 Å. When the thickness of the H-functional layer is within the above ranges, the H-functional layer may have good hole injection and transport capabilities without a substantial increase in driving voltage.

In some embodiments, in addition to the known hole injecting material, the known hole transporting material, and/or the material simultaneously having hole injection and transport capabilities described above, at least one of the HIL, HTL, and H-functional layer may further include an electric charge-generating material for improving conductivity of the layer.

Examples of the electric charge-generating material include quinine derivatives, metal oxides, and cyano compounds, but are not limited thereto. For example, non-limiting examples of the electric charge-generating compound include quinine derivatives such as tetracyanoquinodimethane (TCNQ) and 2,3,5,6-tetrafluorotetracyano-1,4-benzoquinodimethane (F4-TCNQ); metal oxides such as tungsten oxide and molybdenum oxide; and cyano compounds such as compound 200 below.

<Compound 200>

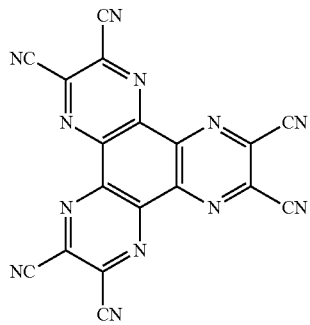

<F4-TCNQ>

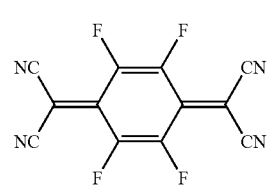

When the HIL, HTL, or H-functional layer further includes an electric charge-generating material, the electric charge-generating material may be included in any manner, such as being homogeneously dispersed or irregularly distributed in the HIL, HTL, or H-functional layer.

A buffer layer may be disposed between the EML and at least one of the HIL, HTL, and H-functional layer. The buffer layer may compensate for an optical resonance distance of light according to a wavelength of the light emitted from the EML, and thus may increase efficiency. The buffer layer may include any hole injecting material or hole transporting material. In some other embodiments, the buffer layer may include the same material as one of the materials included in the HIL, HTL, and H-functional layer that underlies the buffer layer.

Then, an EML may be formed on the HTL, H-functional layer, or buffer layer by vacuum deposition, spin coating, casting, LB deposition, or the like. When the EML is formed using vacuum deposition or spin coating, the deposition or coating conditions may be similar to those used to form the HIL, though the conditions for deposition and coating may vary depending on the compound used to form the EML.

The EML may include a known light-emitting material. For example, the EML may include a known host and a known dopant.

Nonlimiting examples of the host include $Alq_3$, 4,4'-N,N'-dicarbazole-biphenyl (CBP), poly(n-vinylcarbazole) (PVK), 9,10-di(naphthylene-2-yl)anthracene (DNA), TCTA, 1,3,5-tris(N-phenylbenzimidazole-2-yl)benzene (TPBI), 3-tert-butyl-9,10-di(naphth-2-yl) anthracene (TBADN), mCP, OXD-7, or the like.

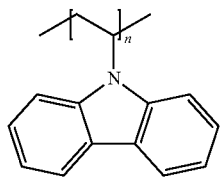

PVK

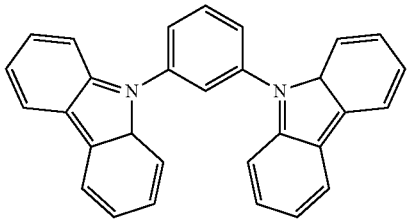

mCP

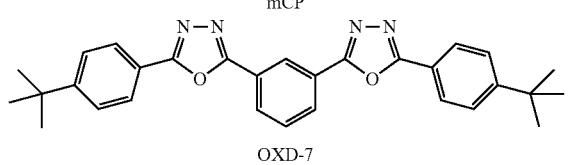

OXD-7

The dopant may be at least one of a fluorescent dopant or a phosphorescent dopant. The phosphorescent dopant may be an organic metal complex including a composite of Ir, Pt, Os, Re, Ti, Zr, Hf, or a combination thereof, but is not limited thereto.

Nonlimiting examples of blue dopants include $F_2Irpic$, $(F_2ppy)_2Ir(tmd)$, $Ir(dfppz)_3$, ter-fluorene, 4,4'-bis(4-diphenylaminostyryl) biphenyl (DPAVBi), 2,5,8,11-tetra-tert-butyl pherylene (TBPe), DPVBi, or the like.

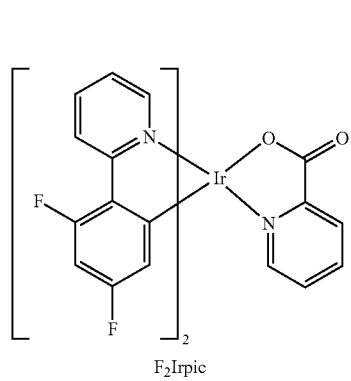
F₂Irpic
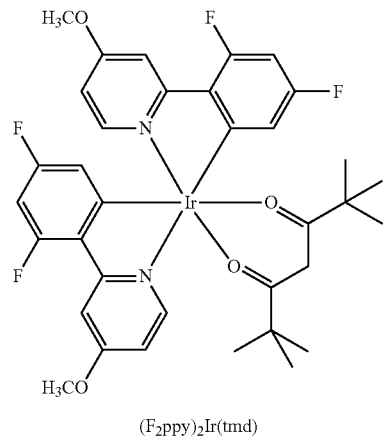
(F₂ppy)₂Ir(tmd)
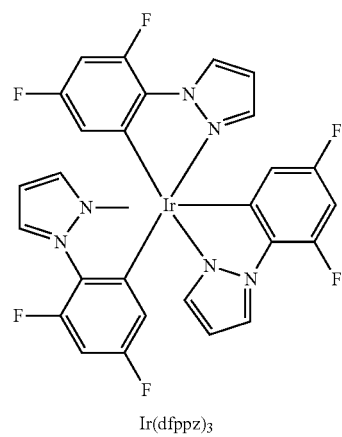
Ir(dfppz)₃
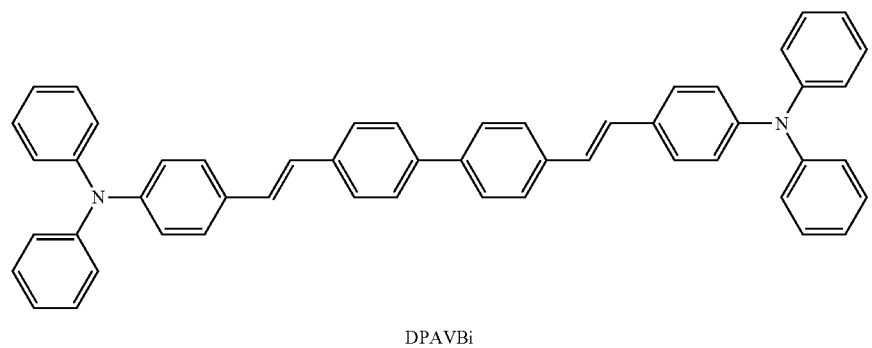
DPAVBi
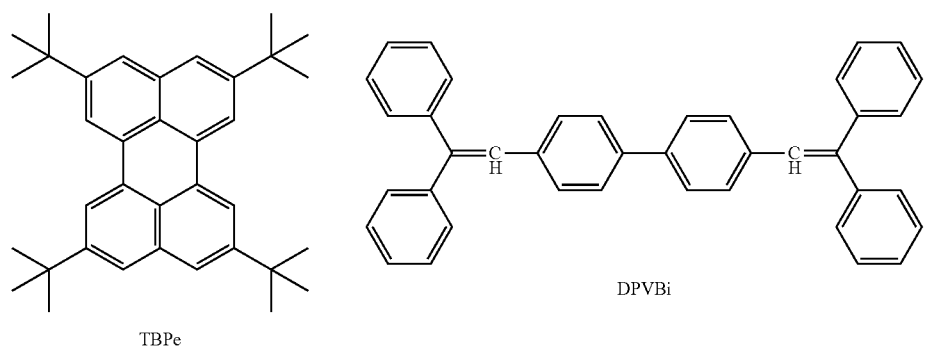
TBPe          DPVBi
Examples of red dopants include PtOEP, Ir(piq)₃, BtpIr, or the like, but are not limited thereto.
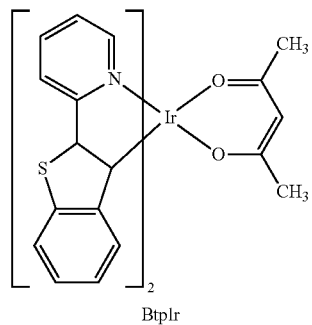
BtpIr
-continued
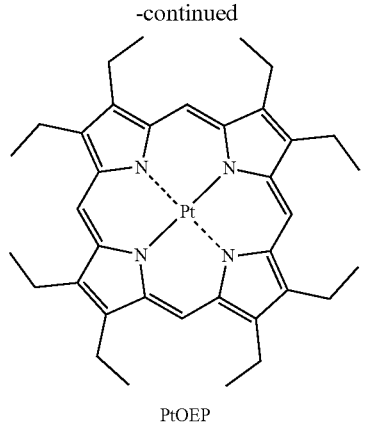
PtOEP

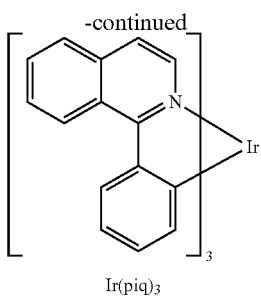

Ir(piq)₃

Examples of green dopants include Ir(ppy)₃ (ppy=phenylpyridine), Ir(ppy)₂(acac), Ir(mpyp)₃, or the like, but are not limited thereto:

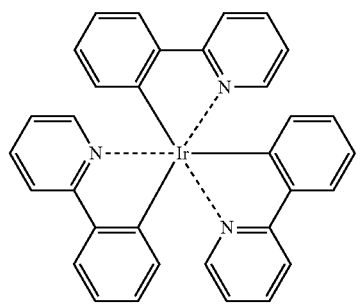

Ir(ppy)₃

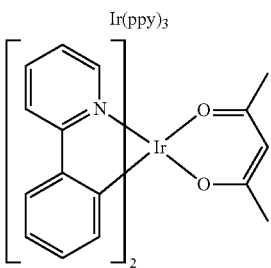

Ir(ppy)₂(acac)

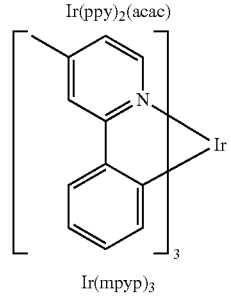

Ir(mpyp)₃

When the EML includes both a host and a dopant, the amount of the dopant may be generally in a range of about 0.01% to about 15% by weight based on 100% by weight of the host, but the present invention is not limited thereto.

A thickness of the EML may be in a range of about 200 Å to about 700 Å. When the thickness of the EML is within the above ranges, the EML may have good light-emitting ability without a substantial increase in driving voltage.

Then, an ETL may be formed on the EML or a hole blocking layer (HBL) by any of a variety of methods, for example, vacuum deposition, spin coating, or casting. When the ETL is formed using vacuum deposition or spin coating, the deposition or coating conditions may be similar to those used to form the HIL, though the deposition or coating conditions may vary depending on the compound used to form the ETL.

Any known electron transporting material that can stably transport electrons injected from an electron injecting electrode (cathode) may be used as the ETL material. Examples of the ETL material include a quinoline derivative such as tris(8-quinolinorate)aluminum (Alq3), TAZ, BAlq, beryllium bis(benzoquinolin-10-olate (Bebq2), 9,10-di(naphthylene-2-yl)anthracene (ADN), Compound 101, Compound 102, Bphen, or the like, but are not limited thereto.

<Compound 101>

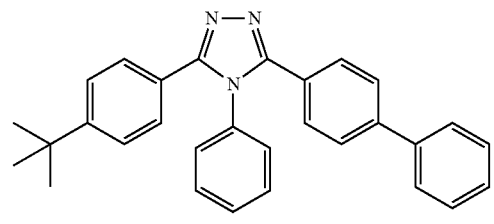

TAZ

<Compound 102>

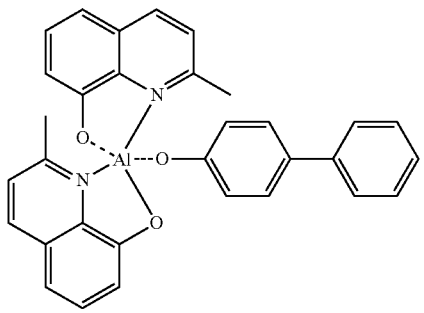

BAlq

Error! Objects cannot be created from editing field codes.

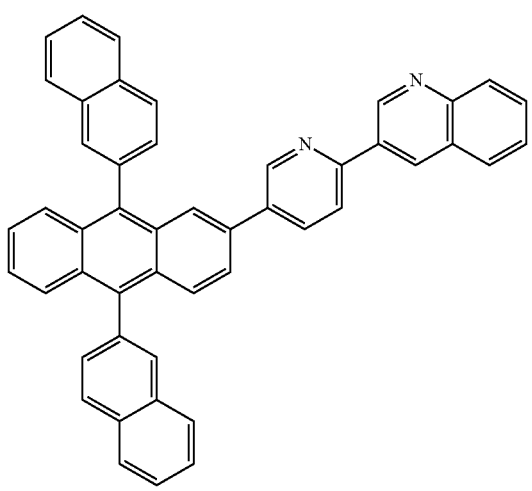

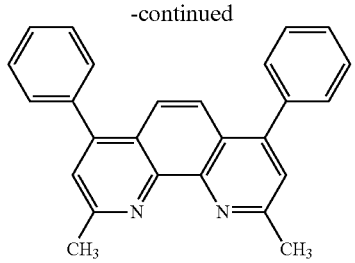

BCP

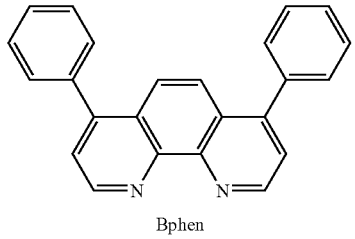

Bphen

A thickness of the ETL may be in a range of about 100 Å to about 1,000 Å, for example, about 150 Å to about 500 Å. When the thickness of the ETL is within the above ranges, the ETL may have satisfactory electron transporting ability without a substantial increase in driving voltage.

In some embodiments, the ETL may further include a metal-containing material in addition to the electron-transporting organic compound. The metal-containing material may include a lithium (Li) complex. Non-limiting examples of the Li complex may be lithium quinolate (LiQ) or Compound 203 below.

<Compound 203>

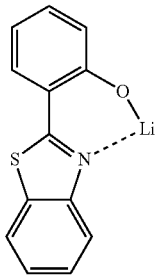

In addition, an electron injection layer (EIL), which facilitates injection of electrons from the cathode, may be disposed on the ETL.

Any suitable electron-injecting material may be used to form the EIL. Nonlimiting examples of the EIL material include EIL-forming materials such as LiF, NaCl, CsF, Li$_2$O, BaO, or the like. The deposition conditions for forming the EIL may be similar to those used to form the HIL, though the deposition conditions may vary depending on the compound used to form the EIL.

A thickness of the EIL may be in a range of about 1 Å to about 100 Å, for example, about 3 Å to about 90 Å. When the thickness of the EIL is within the above ranges, the EIL may have satisfactory electron injection ability without a substantial increase in driving voltage.

A second electrode 17 may be disposed on the organic layer 15. The second electrode 17 may be a cathode, which is an electron injection electrode. Here, the second electrode-forming material may be a metal, an alloy, an electro-conductive compound (which are materials having a low work function), or a mixture thereof. In this regard, the second electrode 16 may be formed as a transmission electrode using lithium (Li), magnesium (Mg), aluminum (Al), aluminum-lithium (Al—Li), calcium (Ca), magnesium-indium (Mg—In), magnesium-silver (Mg—Ag), or the like. In some embodiments, in order to manufacture a top-emission light-emitting diode, the transmission electrode may be formed of indium tin oxide (ITO) or indium zinc oxide (IZO).

Also, when a phosphorescent dopant is used in the EML, an HBL may be formed between the HTL and the EML, or between the H-functional layer and the EML to prevent triplet excitons or holes from dispersing into the electron transport layer. The HBL may be deposited by vacuum deposition, spin coating, casting, LB deposition, or the like. When the HIL is formed by vacuum deposition or spin coating, the deposition or coating conditions may be similar to those used to form the HIL, though the conditions for deposition or coating may vary depending on the compound used to form the HIL. A known hole blocking material may also be used, and examples thereof include an oxadiazole derivative, a triazole derivative, a phenanthroline derivative, or the like. For example, BCP may be used as the hole blocking material.

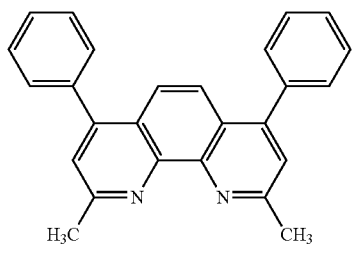

BCP

A thickness of the HBL may be in a range of about 20 Å to about 1,000 Å, for example, about 30 Å to about 300 Å. When the thickness of the EIL is within the above ranges, the EIL may have satisfactory hole blocking ability without a substantial increase in driving voltage.

Although the OLED 10 is described with regard to FIG. 1, the present invention is not limited thereto.

In the present specification, the unsubstituted $C_1$-$C_{60}$ alkyl group (or $C_1$-$C_{60}$ alkyl group) may be a linear or a branched alkyl group having from 1 to 60 carbon atoms, for example, methyl, ethyl, propyl, isobutyl, sec-butyl, pentyl, isoamyl, hexyl, and the like. The substituted $C_1$-$C_{60}$ alkyl group refers to the substitution of at least one hydrogen atom of the unsubstituted $C_1$-$C_{60}$ alkyl group with at least one of a deuterium atom, a halogen atom, a hydroxyl group, a cyano group, a nitro group, an amino group, an amidino group, a hydrazine, a hydrazone, a carboxylic acid group or a salt thereof, a sulfonic acid group or a salt thereof, a phosphoric acid group or a salt thereof, a $C_1$-$C_{60}$ alkyl group, a $C_2$-$C_{60}$ alkenyl group, a $C_2$-$C_{60}$ alkynyl group, or a $C_1$-$C_{60}$ alkoxy group; a $C_1$-$C_{60}$ alkyl group, a $C_2$-$C_{60}$ alkenyl group, a $C_2$-$C_{60}$ alkynyl group, or a $C_1$-$C_{60}$ alkoxy group substituted with at least one of a deuterium atom, a halogen atom, a hydroxyl group, a cyano group, a nitro group, an amino group, an amidino group, a hydrazine, a hydrazone, a carboxylic acid group or a salt thereof, a sulfonic acid group or a salt thereof, or a phosphoric acid group or a salt thereof; a $C_3$-$C_{10}$ cycloalkyl group, a $C_2$-$C_{10}$ heterocycloalkyl group, a $C_3$-$C_{10}$ cycloalkenyl group, a $C_2$-$C_{10}$ heterocycloalkenyl group, a $C_6$-$C_{60}$ aryl group, a $C_6$-$C_{60}$ aryloxy group, a $C_6$-$C_{60}$ arylthio group, or a $C_2$-$C_{60}$ heteroaryl group; a $C_3$-$C_{10}$ cycloalkyl group, a $C_2$-$C_{10}$ heterocycloalkyl group, a $C_3$-$C_{10}$ cycloalkenyl group, a $C_2$-$C_{10}$ heterocycloalkenyl group, a $C_6$-$C_{60}$ aryl group, a $C_6$-$C_{60}$ aryloxy group, a $C_6$-$C_{60}$ arylthio group, or a $C_2$-$C_{60}$ heteroaryl group substituted with at least one of a deuterium atom, a halogen atom, a hydroxyl group, a cyano group, a nitro group, an amino group, an amidino group, a hydrazine, a hydrazone, a carboxylic acid group or a salt thereof, a sulfonic acid group or a salt thereof, a phosphoric acid group or a salt thereof, a $C_1$-$C_{60}$ alkyl group, a $C_2$-$C_{60}$ alkenyl group, a $C_2$-$C_{60}$ alkynyl group, a $C_1$-$C_{60}$ alkoxy group, a phenyl group, a naphthyl group, an anthryl group, a fluorenyl group, a dimethylfluorenyl group, a diphenyl fluorenyl group, a carbazolyl group, a phenylcarbazolyl group, a pyridyl group, a pyrimidyl group, a pyrazinyl group, a pyridazinyl group, a triazinyl group, a quinolyl group, or an isoquinolyl group; or —N($Q_{11}$)($Q_{12}$) (where $Q_{11}$ and $Q_{12}$ may each independently be a $C_6$-$C_{60}$ aryl group or a $C_2$-$C_{60}$ heteroaryl group).

In the present specification, the unsubstituted $C_1$-$C_{60}$ alkoxy group (or $C_1$-$C_{60}$ alkoxy group) is represented by —OA where A is an unsubstituted $C_1$-$C_{60}$ alkyl group as described above. Examples of the unsubstituted $C_1$-$C_{60}$ alkoxy group include a methoxy, an ethoxy, an isopropyloxy, or the like. The substituted $C_1$-$C_{60}$ alkoxy group refers to the substitution of at least one hydrogen atom of the alkoxy group with the substituents described above in connection with the substituted $C_1$-$C_{60}$ alkyl group.

In the present specification, the unsubstituted $C_2$-$C_{60}$ alkenyl group (or $C_2$-$C_{60}$ alkenyl group) refers to a group including at least one carbon-carbon double bond in the middle or at the end of the unsubstituted $C_2$-$C_{60}$ alkenyl group. Examples thereof include an ethenyl, a propenyl, a butenyl, or the like. The substituted $C_2$-$C_{60}$ alkenyl group refers to the substitution of at least one hydrogen atom of the $C_2$-$C_{60}$ alkenyl group with the substituents described above in connection with the substituted $C_1$-$C_{60}$ alkyl group.

In the present specification, the unsubstituted $C_2$-$C_{60}$ alkynyl group (or $C_2$-$C_{60}$ alkynyl group) refers to a group including at least one carbon-carbon triple bond in the middle or at the end of the $C_2$-$C_{60}$ alkynyl group. Examples thereof include an ethynyl, a propenyl, or the like. The substituted $C_2$-$C_{60}$ alkynyl group refers to the substitution of at least one hydrogen atom of the $C_2$-$C_{60}$ alkynyl group with the substituents described above in connection with the substituted $C_1$-$C_{60}$ alkyl group.

In the present specification, the unsubstituted $C_3$-$C_{30}$ cycloalkyl group refers to a cyclic saturated monovalent hydrocarbon having from 3 to 60 carbon atoms. Examples thereof include a cyclopropyl, a cyclobutyl, a cyclopentyl, a cyclohexyl, a cyclooctyl, or the like. The substituted $C_3$-$C_{30}$ cycloalkyl group refers to the substitution of at least one hydrogen atom of the cycloalkyl group with the substituents described above in connection with the substituted $C_1$-$C_{60}$ alkyl group.

In the present specification, the unsubstituted $C_3$-$C_{30}$ cycloalkenyl group refers to a group having at least one carbon-carbon double bond and an unsaturated hydrocarbon ring that is not an aromatic ring. Examples of the unsubstituted $C_3$-$C_{30}$ cycloalkenyl group include a cyclopropenyl, a cyclobutenyl, a cyclopentenyl, a cyclohexenyl, a cycloheptenyl, a 1,3-cyclohexadienyl group, a 1,4-cyclohexadienyl group, a 2,4-cycloheptadienyl group, a 1,5-cyclooctadienyl group, or the like. The substituted $C_3$-$C_{30}$ cycloalkenyl group refers to the substitution of at least one hydrogen atom of the cycloalkenyl group with the substituents described above in connection with the substituted $C_1$-$C_{60}$ alkyl group.

In the present specification, the unsubstituted $C_6$-$C_{60}$ aryl group refers to a monovalent group having a carbocyclic aromatic system having 6 to 60 carbon atoms including at least one aromatic ring. The unsubstituted $C_6$-$C_{60}$ arylene group refers to a divalent group having a carbocyclic aromatic system having 6 to 60 carbon atoms including at least one aromatic ring. When the aryl group and the arylene group have at least two rings, they may be fused to each other. The substituted $C_6$-$C_{60}$ aryl group and $C_6$-$C_{60}$ arylene group refer to the substitution of at least one hydrogen atom of the aryl group or the arylene group with the substituents described above in connection with the $C_1$-$C_{60}$ alkyl group.

Examples of the substituted or unsubstituted $C_6$-$C_{60}$ aryl group include a phenyl group, a $C_1$-$C_{10}$ alkylphenyl group (e.g., an ethylphenyl group), a $C_1$-$C_{10}$ alkylbiphenyl group (e.g., an ethylbiphenyl group), a halophenyl group (e.g., an o-, m-, or p-fluorophenyl group or a dichlorophenyl group), a dicyanophenyl group, a trifluoromethoxyphenyl group, an o-, m- or p-tolyl group, an o-, m- or p-cumenyl group, a mesityl group, a phenoxyphenyl group, an (α,α-dimethylbenzene)phenyl group, an (N,N'-dimethyl)aminophenyl group, an (N,N'-diphenyl)aminophenyl group, a pentalenyl group, an indenyl group, a naphthyl group, a halonaphthyl group (e.g., a fluoronaphthyl group), a $C_1$-$C_{10}$ alkylnaphthyl group (e.g., a methylnaphthyl group), a $C_1$-$C_{10}$ alkoxynaphthyl group (e.g., a methoxynaphthyl group), an anthracenyl group, an azulenyl group, a heptalenyl group, an acenaphthylenyl group, a phenalenyl group, a fluorenyl group, an anthraquinolyl group, a methylanthryl group, a phenanthryl group, a triphenylenyl group, a pyrenyl group, a chrysenyl group, an ethyl-chrysenyl group, a picenyl group, a perylenyl group, a chloroperylenyl group, a pentaphenyl group, a pentacenyl group, a tetraphenylenyl group, a hexaphenyl group, a hexacenyl group, a rubicenyl group, a coronenyl group, a trinaphthylenyl group, a heptaphenyl group, a heptacenyl group, a pyranthrenyl group, an ovalenyl group, or the like. Examples of the substituted $C_6$-$C_{60}$ aryl group may be inferred from the examples of the unsubstituted $C_6$-$C_{60}$ aryl group and the substituted $C_1$-$C_{60}$ alkyl group described above. Examples of the substituted and unsubstituted $C_6$-$C_{60}$ arylene group may be inferred from the examples of the substituted and unsubstituted $C_6$-$C_{60}$ aryl group described above.

In the present specification, the unsubstituted $C_2$-$C_{60}$ heteroaryl group refers to a monovalent group having at least one aromatic ring having at least one heteroatom selected from N, O, P, and S. The unsubstituted $C_2$-$C_{60}$ heteroarylene group may be a divalent group having at least one aromatic ring having at least one heteroatom selected from N, O, P, and S. Here, when the heteroaryl group or the heteroarylene group has at least two rings, they may be fused to each other. The substituted $C_2$-$C_{60}$ heteroaryl group and $C_2$-$C_{60}$ heteroarylene group refer to the substitution of at least one hydrogen atom of the heteroaryl group or the heteroarylene group with the substituents described with reference to the $C_1$-$C_{60}$ alkyl group.

Examples of the unsubstituted $C_2$-$C_{60}$ heteroaryl group include a pyrazolyl group, an imidazolyl group, an oxazolyl group, a thiazolyl group, a triazolyl group, a tetrazolyl group, an oxadiazolyl group, a pyridinyl group, a pyridazinyl group, a pyrimidyl group, a triazinyl group, a carbazolyl group, an indolyl group, a quinolinyl group, an isoquinolinyl group, a benzoimidazolyl group, an imidazopyridinyl group, an imidazopyrimidyl group, or the like. Examples of the substituted or unsubstituted $C_2$-$C_{60}$ heteroarylene group may be inferred from the examples of the substituted or unsubstituted $C_2$-$C_{60}$ arylene group described above.

The substituted or unsubstituted $C_6$-$C_{60}$ aryloxy group refers to a group represented by —$OA_2$ where $A_2$ is a substituted or unsubstituted $C_6$-$C_{60}$ aryl group described above. The substituted or unsubstituted $C_6$-$C_{60}$ arylthio group refers to a group represented by —$SA_3$ where $A_3$ is a substituted or unsubstituted $C_6$-$C_{60}$ aryl group described above.

Hereinafter, one or more embodiments of the present invention will be described with reference to the following examples. However, these examples are presented for illustrative purposes only and are not intended to limit the scope of the one or more embodiments of the present invention.

SYNTHESIS EXAMPLE 1

Synthesis of Compound 1

Compound 1 was synthesized according to Reaction Scheme 1 below:

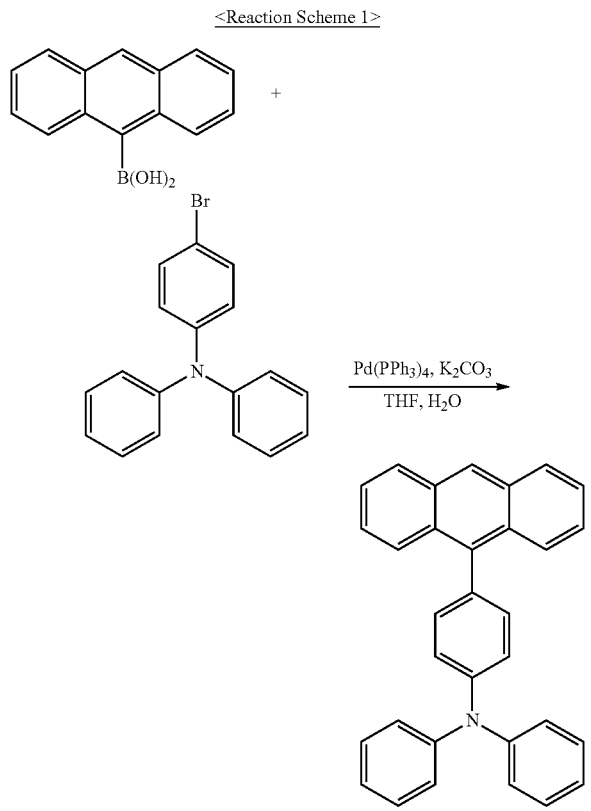

Anthracene-9-yl-boronic acid (0.685 g, 3.1 mmol), 4-bromo triphenylamine, (1 g, 3.1 mmol), 16 ml of 2M potassium carbonate, and Pd(PPh$_3$)$_4$ (0.18 g, 0.155 mmol) were dissolved in dimethoxy ethanol and refluxed for about 15 hours under an inert atmosphere. After cooling down the mixture to room temperature, the solvent was evaporated in vacuum and the residue was dissolved in dimethyl chloride. Then, the organic phase was washed with distilled water, and moisture was removed by drying with Na$_2$SO$_4$. The solvent was removed to obtain a crude product. The crude product was then subjected to silica gel column chromatography using dimethyl chloride, ethyl acetate, and methanol as eluents to obtain Compound 1 (0.87 g, yield 67%). Compound 1 was observed through $^1$H NMR and MALDI-TOF MS.

$^1$H NMR (300 MHz, DMSO-d$_6$): δ(ppm) 8.65 (s, 1H), 8.14 (d, 6 Hz, 2H), 7.69 (d, 6 Hz, 2H), 7.55-7.46 (m, 4H), 7.42 (t, 4 Hz, 4H), 7.34 (q, 6 Hz 2H), 7.29-7.17 (m, 6H), 7.10 (t, 6 Hz, 2H)

MALDI-TOF MS: C$_{32}$H$_{23}$N, measured value 421.18 g/mol, estimated value 421.04 g/mol

SYNTHESIS EXAMPLE 2

Synthesis of Compound 6

Compound 6 was synthesized according to Reaction Scheme 2 below:

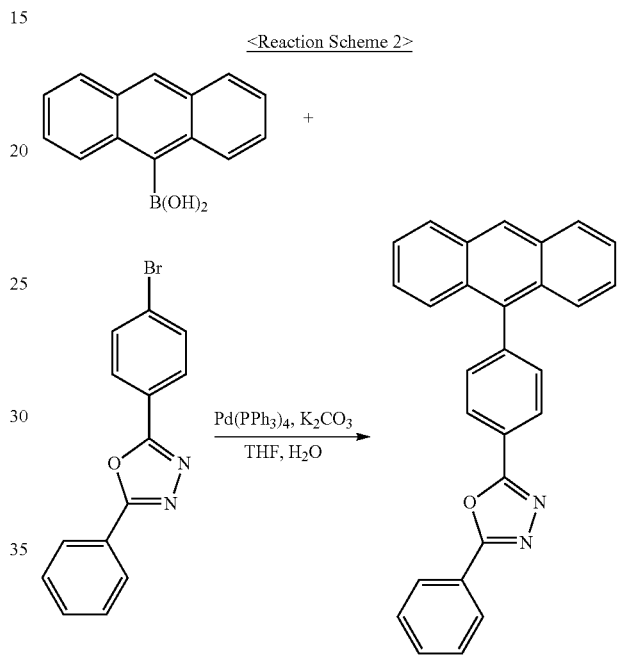

Anthracene-9-yl-boronic acid (0.737 g, 3.3 mmol), 2-(4-bromo-phenyl)-5-phenyl[1,3,4]oxadiazole (1 g, 3.3 mmol), 20 ml of 2M potassium carbonate, and Pd(PPh$_3$)$_4$ (0.19 g, 0.65 mmol) were dissolved in dimethoxy ethanol and refluxed for about 15 hours under an inert atmosphere. After cooling down the mixture to room temperature, the solvent was evaporated in vacuum and the residue was dissolved in dimethyl chloride. Then, the organic phase was washed with distilled water, and moisture was removed by drying with Na$_2$SO$_4$. The solvent was removed to obtain a crude product. The crude product was then subjected to silica gel column chromatography using dimethyl chloride, ethyl acetate, and methanol as eluents to obtain Compound 6 (0.945 g, yield 71%). Compound 6 was observed through $^1$H NMR and MALDI-TOF MS.

$^1$H NMR (300 MHz, DMSO-d$_6$): δ(ppm) 8.17 (t, 9 Hz, 4H), 7.91 (d, 6 Hz, 2H), 7.72 (d, 6 Hz, 2H), 6.66 (d, 3 Hz, 3H), 7.35 (t, 9 Hz, 4H), 7.10 (q, 6 Hz 8H)

MALDI-TOF MS: C$_{28}$H$_{18}$N$_2$O, measured value 398.14 g/mol, estimated value 398.00 g/mol

EXAMPLE 1

As an anode, a Corning 15Ω/cm$^2$ (1200 Å) ITO glass substrate was cut into a size of 50 mm×50 mm×0.7 mm, ultrasonically washed for about 5 minutes using isopropyl alcohol and distilled water, irradiated with ultraviolet rays for about 30 minutes, and washed by exposure to ozone for about 10 minutes. The glass substrate was installed on a vacuum deposition device.

Phthalocyanine (CuPc) was vacuum deposited on top of the ITO glass substrate to form an HIL having a thickness of 1,00 Å. On the HIL, N,N'-bis(naphthylene-1-yl)-N,N-bis(phenyl)-benzidine (NPB) was vacuum deposited to form an HTL having a thickness of 700 Å.

Compound 1 was vacuum deposited on the HTL to form a first EML having a thickness of 300 Å. Compound 6 was vacuum deposited on the first EML to form a second EML having a thickness of 100 Å.

Bis(2-methyl-8-quinolate-4-(phenylpenolato)aluminum (BAlq) was vacuum deposited on the second EML to form an HTL having a thickness of 200 Å, and 8-hydroxyquinolinolato-lithium (LiQ) was vacuum deposited on the HTL to form an HIL having a thickness of 5 Å. In addition, Al was vacuum deposited on the HIL to form a cathode having a thickness of 1,000 Å, thereby completing the manufacture of an OLED.

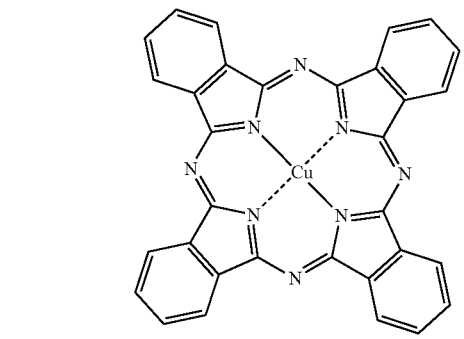

CuPc

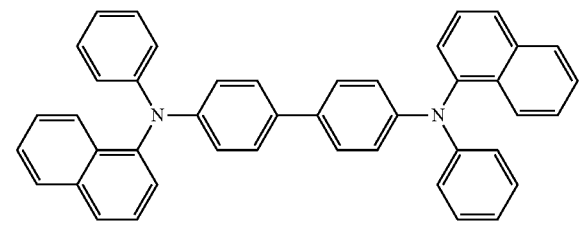

NPD

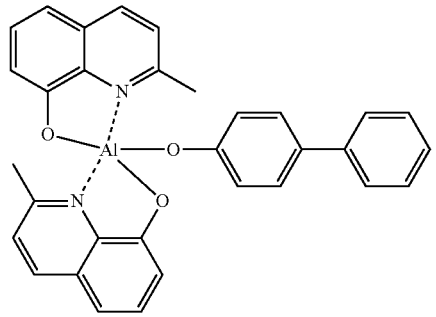

BAlq

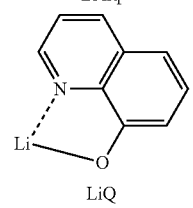

LiQ

EXAMPLE 2

An OLED was manufactured as in Example 1, except that Compound 1 and Compound 6 were vacuum deposited in a weight ratio of 3:1 to form an EML having a thickness of 400 Å (instead of a first EML and a second EML).

Comparative Example 1

An OLED was manufactured as in Example 1, except that Compound 1 was vacuum deposited to form an EML having a thickness of 400 Å (instead of a first EML and a second EML).

COMPARATIVE EXAMPLE 2

An OLED was manufactured as in Example 1, except that Compound 6 was vacuum deposited to form an EML having a thickness of 400 Å (instead of a first EML and a second EML).

COMPARATIVE EXAMPLE 3

An OLED was manufactured as in Example 1, except that Compound A and Compound B (below) were vacuum deposited in a weight ratio of 3:1 to form an EML having a thickness of 400 Å (instead of a first EML and a second EML).

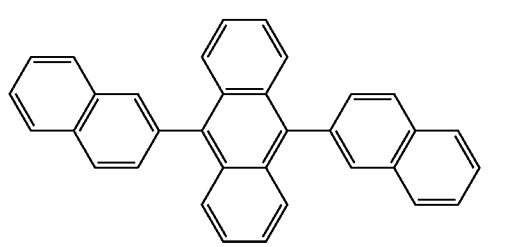

Compound A

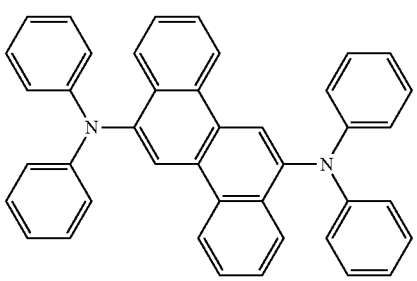

Compound B

COMPARATIVE EXAMPLE 4

An OLED was manufactured as in Example 1, except that Compound C and Compound D below were vacuum deposited in a weight ratio of 3:1 to form an EML having a thickness of 400 Å (instead of a first EML and a second EML).

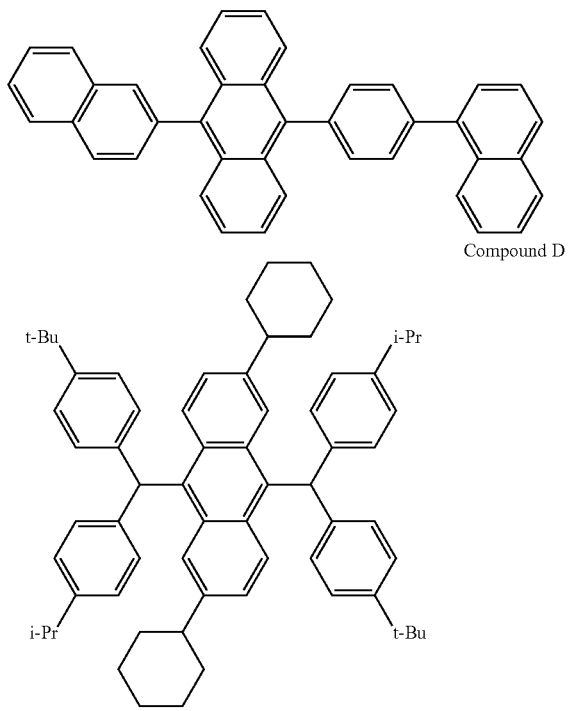

EVALUATION EXAMPLE 1

Brightness and efficiency of the OLEDs prepared according to Examples 1 and 2 and Comparative Examples 1 to 4 were evaluated using a PR650 Spectroscan Source Measurement Unit (manufactured by PhotoResearch). The results are shown in Table 1 below:

TABLE 1

| | Light-emitting materials | Brightness | Efficiency |
|---|---|---|---|
| | 1st EML material / 2nd EML material | (cd/m²) @ 10 mA | (cd/A) @ 10 mA |
| Comparative Example 1 | Compound 1 | 118 | 1.2 |
| Comparative Example 2 | Compound 6 | 112 | 1.5 |
| Comparative Example 3 | Compound A:Compound B = 3:1 (w/w) | 135 | 1.8 |
| Comparative Example 4 | Compound C:Compound D = 3:1 (w/w) | 134 | 1.7 |
| Example 1 | Compound 1   Compound 15 | 217 | 2.7 |
| Example 2 | Compound 1:Compound 15 = 3:1 (w/w) | 194 | 2.8 |

According to Table 1 above, it was confirmed that the OLEDs prepared according to Examples 1 and 2 had greater brightness and efficiency than the OLEDs prepared according to Comparative Examples 1 to 4.

While the present invention has been illustrated and described with reference to certain exemplary embodiments, those of ordinary skill in the art will understand that various changes may be made to the described embodiments without departing from the spirit and scope of the present invention as defined by the following claims.

What is claimed is:

1. An organic light-emitting diode comprising:
   a first electrode;
   a second electrode; and
   an organic layer between the first electrode and the second electrode and including an emission layer, the organic layer comprising at least one amine-based compound represented by Formula 1 and at least one anthracene-based compound represented by Formula 2:

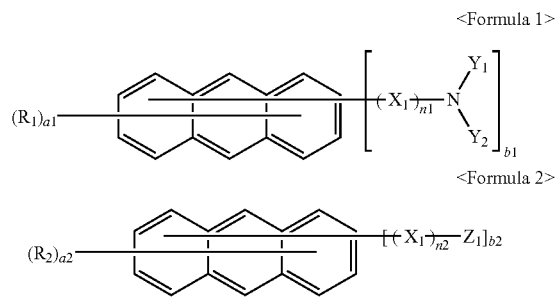

wherein in Formulas 1 and 2:
   $X_1$ and $X_2$ are each independently a substituted or unsubstituted $C_3$-$C_{10}$ cycloalkylene group, a substituted or unsubstituted $C_2$-$C_{10}$ heterocycloalkylene group, a substituted or unsubstituted $C_3$-$C_{10}$ cycloalkenylene group, a substituted or unsubstituted $C_2$-$C_{10}$ heterocycloalkenylene group, a substituted or unsubstituted $C_6$-$C_{60}$ arylene group, or a substituted or unsubstituted $C_2$-$C_{60}$ heteroarylene group;
   n1 and n2 are each independently an integer from 0 to 5, and when n1 is an integer of 2 or more, the 2 or more $X_1$ groups are the same or different, and when n2 is an integer of 2 or more, the 2 or more $X_2$ groups are the same or different;
   $Y_1$ and $Y_2$ are each independently a hydrogen atom, a deuterium atom, a halogen atom, a hydroxyl group, a cyano group, a nitro group, an amino group, an amidino group, a hydrazine, a hydrazone, a carboxylic acid group or a salt thereof, a sulfonic acid group or a salt thereof, a phosphoric acid group or a salt thereof, a substituted or unsubstituted $C_1$-$C_{30}$ alkyl group, a substituted or unsubstituted $C_2$-$C_{60}$ alkenyl group, a substituted or unsubstituted $C_2$-$C_{60}$ alkynyl group, a substituted or unsubstituted $C_3$-$C_{10}$ cycloalkyl group, a substituted or unsubstituted $C_2$-$C_{10}$ heterocycloalkyl group, a substituted or unsubstituted $C_3$-$C_{10}$ cycloalkenyl group, a substituted or unsubstituted $C_2$-$C_{10}$ heterocycloalkenyl group, a substituted or unsubstituted $C_6$-$C_{30}$ aryl group, or a substituted or unsubstituted $C_2$-$C_{30}$ heteroaryl group;
   $Z_1$ is an electron transporting group and is a substituted or unsubstituted $C_2$-$C_{10}$ heterocycloalkyl group, a substituted or unsubstituted $C_2$-$C_{10}$ heterocycloalkenyl group, or a substituted or unsubstituted $C_2$-$C_{60}$ heteroaryl group;
   $R_1$ and $R_2$ are each independently a hydrogen atom, a deuterium atom, a halogen atom, a hydroxyl group, a cyano group, a nitro group, an amino group, an amidino group, a hydrazine, a hydrazone, a carboxylic acid group or a salt thereof, a sulfonic acid group or a salt thereof, a phosphoric acid group or a salt thereof, a substituted or unsubstituted $C_1$-$C_{60}$ alkyl group, a substituted or unsubstituted $C_2$-$C_{60}$ alkenyl group, a substituted or unsubstituted $C_2$-$C_{60}$ alkynyl group, a substituted or unsubstituted $C_1$-$C_{60}$ alkoxy group, a substituted or unsubstituted $C_3$-$C_{10}$ cycloalkyl group, a substituted or unsubstituted $C_2$-$C_{10}$ heterocycloalkyl group, a substituted or unsubstituted $C_3$-$C_{10}$ cycloalkenyl group, a substituted or unsubstituted $C_2$-$C_{10}$ heterocycloalkenyl group, a substituted or unsubstituted $C_6$-$C_{60}$ aryl group, a substituted or unsubstituted $C_6$-$C_{60}$ aryloxy group, a substituted or unsubstituted $C_6$-$C_{60}$ arylthio group, or a substituted or unsubstituted $C_2$-$C_{60}$ heteroaryl group;

a1 and a2 are each independently an integer from 0 to 9, and when a1 is an integer of 2 or more, the 2 or more $R_1$ groups are the same or different, and when a2 is an integer of 2 or more, the 2 or more $R_2$ groups are the same or different; and b1 and b2 are each independently an integer of 1 or 2.

2. The organic light-emitting diode of claim 1, wherein $X_1$ and $X_2$ are each independently:
   i) a phenylene group, a naphthylene group, an anthracenylene group, or a fluorenylene group; or
   ii) a phenylene group, a naphthylene group, an anthracenylene group or a fluorenylene group substituted with at least one of a deuterium atom, a halogen atom, a hydroxyl group, a cyano group, a nitro group, an amino group, an amidino group, a hydrazine, a hydrazone, a carboxylic acid group or a salt thereof, a sulfonic acid group or a salt thereof, a phosphoric acid group or a salt thereof, or a $C_1$-$C_{10}$ alkyl group; a $C_1$-$C_{10}$ alkyl group substituted with at least one of a deuterium atom, a halogen atom, a hydroxyl group, a cyano group, a nitro group, an amino group, an amidino group, a hydrazine, a hydrazone, a carboxylic acid group or a salt thereof, a sulfonic acid group or a salt thereof, a phosphoric acid group or a salt thereof; a $C_6$-$C_{16}$ aryl group, or a $C_2$-$C_{16}$ heteroaryl group; or a $C_6$-$C_{16}$ aryl group or a $C_2$-$C_{16}$ heteroaryl group substituted with at least one of a deuterium atom, a halogen atom, a hydroxyl group, a cyano group, a nitro group, an amino group, an amidino group, a hydrazine, a hydrazone, a carboxylic acid group or a salt thereof, a sulfonic acid or a salt thereof, a phosphoric acid or a salt thereof, a $C_1$-$C_{60}$ alkyl group, a $C_2$-$C_{60}$ alkenyl group, a $C_2$-$C_{60}$ alkynyl group, a $C_1$-$C_{60}$ alkoxy group, a $C_6$-$C_{16}$ aryl group, or $C_2$-$C_{16}$ heteroaryl group.

3. The organic light-emitting diode of claim 1, wherein $X_1$ and $X_2$ are each independently:
   i) a phenylene group, a naphthylene group, or an anthracenylene group; or
   ii) a phenylene group, a naphthylene group, or an anthracenylene group substituted with at least one of a deuterium atom, —F, a cyano group, a nitro group, a methyl group, an ethyl group, an n-propyl group, an iso-propyl group, an n-butyl group, an iso-butyl group, or a tert-butyl group; or
   iii) a phenylene group, a naphthylene group, or an anthracenylene group substituted with at least one of a methyl group, an ethyl group, an n-propyl group, an iso-propyl group, an n-butyl group, an iso-butyl group, or a tert-butyl group substituted with at least one of a deuterium atom, —F, a cyano group, a nitro group, a methyl group, an ethyl group, an n-propyl group, an iso-propyl group, an n-butyl group, an iso-butyl group, or a tert-butyl group; or
   iv) a phenylene group, a naphthylene group, or an anthracenylene group substituted with at least one of a phenyl group, a naphthyl group, an anthracenyl group, or a fluorenyl group; or
   v) a phenylene group or a naphthylene group substituted with at least one of a phenyl group, a naphthyl group, an anthracenyl group, or a fluorenyl group substituted with at least one of a deuterium atom, —F, a cyano group, a nitro group, a methyl group, an ethyl group, an n-propyl group, an iso-propyl group, an n-butyl group, an iso-butyl group, a tert-butyl group, a pyrrolyl group, an imidazolyl group, pyrazolyl group, a triazolyl group, an isoindolyl group, an indolyl group, an indazolyl group, a purinyl group, a benzoimidazolyl group, an oxazolyl group, an isoxazolyl group, an oxadiazolyl group, or a benzoxazolyl group.

4. The organic light-emitting diode of claim 1, wherein $X_1$ and $X_2$ are each independently a group represented by Formula 4a:

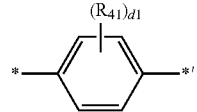

<Formula 4a> wherein in Formula 4a:
   $R_{41}$ is a hydrogen atom, a deuterium atom, —F, a cyano group, a methyl group, an ethyl group, an n-propyl group, an iso-propyl group, an n-butyl group, an iso-butyl group, or a tert-butyl group;
   d1 is integer of 0 to 4, and when d1 is an integer of 2 or more, the 2 or more $R_{41}$ groups are the same or different;
   * is a bonding site to an anthracene ring; and
   *' is a binding site to N or Z.

5. The organic light-emitting diode of claim 1, wherein n1 and n2 are both 1.

6. The organic light-emitting diode of claim 1, wherein $Y_1$ and $Y_2$ are each independently:
   i) a phenyl group, a naphthyl group, an anthryl group, a fluorenyl group, a furanyl group, a benzofuranyl group, or a dibenzofuranyl group; or
   ii) a phenyl group, a naphthyl group, an anthryl group, a fluorenyl group, a furanyl group, a benzofuranyl group, or a dibenzofuranyl group substituted with at least one of a deuterium atom, a halogen atom, a hydroxyl group, a cyano group, a nitro group, an amino group, an amidino group, a hydrazine, a hydrazone, a carboxylic acid group or a salt thereof, a sulfonic acid group or a salt thereof, or a phosphoric acid group or a salt thereof, or a $C_1$-$C_{10}$ alkyl group; a $C_1$-$C_{10}$ alkyl group substituted with at least one of a deuterium atom, a halogen atom, a hydroxyl group, a cyano group, a nitro group, an amino group, an amidino group, a hydrazine, a hydrazone, a carboxylic acid group or a salt thereof, a sulfonic acid group or a salt thereof, a phosphoric acid group or a salt thereof; a $C_6$-$C_{16}$ aryl group or a $C_2$-$C_{16}$ heteroaryl group; or a $C_6$-$C_{16}$ aryl group or a $C_2$-$C_{16}$ heteroaryl group substituted with at least one of a deuterium atom, a halogen atom, a hydroxyl group, a cyano group, a nitro group, an amino group, an amidino group, a hydrazine, a hydrazone, a carboxylic acid group or a salt thereof, a sulfonic acid or a salt thereof, a phosphoric acid or a salt thereof, a $C_1$-$C_{60}$ alkyl group, a $C_2$-$C_{60}$ alkenyl group, a $C_2$-$C_{60}$ alkynyl group, a $C_1$-$C_{60}$ alkoxy group, a $C_6$-$C_{16}$ aryl group, or a $C_2$-$C_{16}$ heteroaryl group.

7. The organic light-emitting diode of claim 1, wherein $Y_1$ and $Y_2$ are each independently:

i) a phenyl group, a naphthyl group, an anthryl group, a fluorenyl group, a furanyl group, a benzofuranyl group, or a dibenzofuranyl group; or ii) a phenyl group, a naphthyl group, an anthryl group, a fluorenyl group, a furanyl group, a benzofuranyl group, or a dibenzofuranyl group substituted with at least one of a deuterium atom, —F, a cyano group, a nitro group, a methyl group, an ethyl group, an n-propyl group, an iso-propyl group, an n-butyl group, an iso-butyl group, or a tert-butyl group; or iii) a phenyl group, a naphthyl group, an anthryl group, a fluorenyl group, a furanyl group, a benzofuranyl group, or a dibenzofuranyl group substituted with at least one of a phenyl group, a naphthyl group, an anthracenyl group, or a fluorenyl group; or iv) a phenyl group, a naphthyl group, an anthryl group, a fluorenyl group, a furanyl group, a benzofuranyl group, or a dibenzofuranyl group substituted with at least one of a phenyl group, a naphthyl group, an anthracenyl group, or a fluorenyl group substituted with at least one of a deuterium atom, —F, a cyano group, a nitro group, a methyl group, an ethyl group, an n-propyl group, an iso-propyl group, an n-butyl group, an iso-butyl group, a tert-butyl group, a pyrrolyl group, a imidazolyl group, a pyrazolyl group, a triazolyl group, an isoindolyl group, an indolyl group, an indazolyl group, a purinyl group, a benzoimidazolyl group, an oxazolyl group, an isoxazolyl group, an oxadiazolyl group, or a benzoxazolyl group.

8. The organic light-emitting diode of claim 1, wherein $Y_1$ and $Y_2$ are each independently:

i) a phenyl group, a fluorenyl group, or a dibenzofuranyl group; or ii) a phenyl group, a fluorenyl group, or a dibenzofuranyl group substituted with at least one of a deuterium atom, —F, a cyano group, a nitro group, a methyl group, an ethyl group, an n-propyl group, an iso-propyl group, an n-butyl group, or an iso-butyl group; or iii) a phenyl group, a fluorenyl group, or a dibenzofuranyl group substituted with at least one of a phenyl group, a naphthyl group, an anthracenyl group, or a fluorenyl group.

9. The organic light-emitting diode of claim 1, wherein $Y_1$ and $Y_2$ are each independently at least one group represented by one of Formulas 5a to 5e:

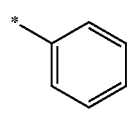

<Formula 5a>

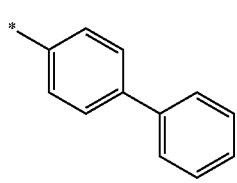

<Formula 5b>

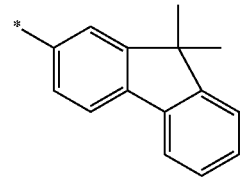

<Formula 5c>

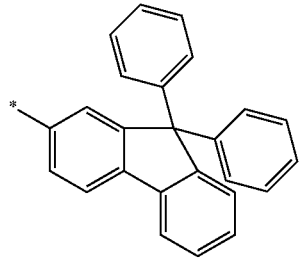

<Formula 5d>

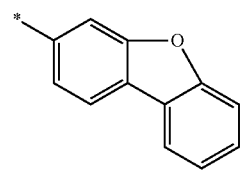

<Formula 5e> wherein in Formulas 5a to 5e, * is a bonding site to N.

10. The organic light-emitting diode of claim 1, wherein $Z_1$ is:

i) a pyrrolyl group, an imidazolyl group, a pyrazolyl group, a triazolyl group, an isoindolyl group, an indolyl group, an indazolyl group, a purinyl group, a benzoimidazolyl group, an oxazolyl group, an isooxazolyl group, an oxadiazolyl group, or a benzoxazolyl group; or ii) a pyrrolyl group, an imidazolyl group, a pyrazolyl group, a triazolyl group, an isoindolyl group, an indolyl group, an indazolyl group, a purinyl group, a benzoimidazolyl group, an oxazolyl group, an isooxazolyl group, an oxadiazolyl group, or a benzoxazolyl group substituted with at least one of a deuterium atom, a halogen atom, a hydroxyl group, a cyano group, a nitro group, an amino group, an amidino group, a hydrazine, a hydrazone, a carboxylic acid group or a salt thereof, a sulfonic acid group or a salt thereof, a phosphoric acid group or a salt thereof, or a $C_1$-$C_{10}$ alkyl group; a $C_1$-$C_{10}$ alkyl group substituted with at least one of a deuterium atom, a halogen atom, a hydroxyl group, a cyano group, a nitro group, an amino group, an amidino group, a hydrazine, a hydrazone, a carboxylic acid group or a salt thereof, a sulfonic acid group or a salt thereof, or a phosphoric acid group or a salt thereof; a $C_6$-$C_{16}$ aryl group or a $C_2$-$C_{16}$ heteroaryl group; or a $C_6$-$C_{16}$ aryl group or a $C_2$-$C_{16}$ heteroaryl group substituted with at least one of a deuterium atom, a halogen atom, a hydroxyl group, a cyano group, a nitro group, an amino group, an amidino group, a hydrazine, a hydrazone, a carboxylic acid group or a salt thereof, a sulfonic acid group or a salt thereof, a phosphoric acid group or a salt thereof, a $C_1$-$C_{60}$ alkyl group, a $C_2$-$C_{60}$ alkenyl group, a $C_2$-$C_{60}$ alkynyl group, a $C_1$-$C_{60}$ alkoxy group, a $C_6$-$C_{16}$ aryl group, or a $C_2$-$C_{16}$ heteroaryl group.

11. The organic light-emitting diode of claim 1, wherein $Z_1$ is:

i) an oxazolyl group, an isoxazolyl group, or an oxadiazolyl group; or ii) an oxazolyl group or an isoxazolyl group substituted with at least one of a deuterium atom, —F, a cyano group, a nitro group, a methyl group, an ethyl group, an n-propyl group, an iso-propyl group, an n-butyl group, an iso-butyl group, or a tert-butyl group; or iii) an oxazolyl group or an isoxazolyl group substituted with at least one of a phenyl group, a naphthyl group, an anthracenyl group, a pyrrolyl group, an imidazolyl group, a pyrazolyl group, or a triazolyl group; or iv) an oxazolyl group or an isoxazolyl group substituted with at least one of a phenyl group, a naphthyl group, an anthracenyl group, a pyrrolyl group, an imidazolyl group, a pyrazolyl group, or a triazolyl group substituted with a deuterium atom, —F, a cyano group, a nitro group, a methyl group, an ethyl group, an n-propyl group, an iso-propyl group, an n-butyl group, an iso-butyl group, tert-butyl group, a phenyl group, a naphthyl group, or an anthracenyl group.

12. The organic light-emitting diode of claim 1, wherein $Z_1$ is at least one group represented by one of Formulas 3a to 3e:

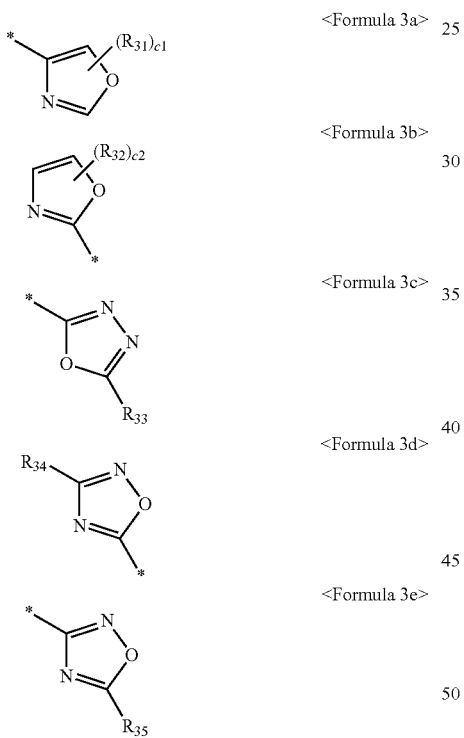

<Formula 3a>

<Formula 3b>

<Formula 3c>

<Formula 3d>

<Formula 3e> wherein, in Formulas 3a to 3e:

$R_{31}$ to $R_{35}$ are each independently a hydrogen atom, a deuterium atom, —F, a cyano group, a methyl group, an ethyl group, a phenyl group, a biphenyl group, or a naphthyl group;

c1 and c2 are each independently an integer of 0 to 4, and when c1 is an integer of 2 or more, the 2 or more $R_{31}$ groups are the same or different, and when c2 is an integer of 2 or more, the 2 or more $R_{32}$ groups are the same or different; and

* is a bonding site to $X_2$.

13. The organic light-emitting diode of claim 1, wherein $R_1$ and $R_2$ are each independently a deuterium atom, a halogen atom, a hydroxyl group, a cyano group, a nitro group, or a $C_1$-$C_{10}$ alkyl group; a $C_1$-$C_{10}$ alkyl group substituted with at least one of a deuterium atom, a halogen atom, a hydroxyl group, a cyano group, a nitro group, an amino group, an amidino group, a hydrazine, a hydrazone, a carboxylic acid group or a salt thereof, a sulfonic acid group or a salt thereof, or a phosphoric acid group or a salt thereof; a $C_6$-$C_{16}$ aryl group; or a $C_6$-$C_{16}$ aryl group substituted with at least one of a deuterium atom, a halogen atom, a hydroxyl group, a cyano group, a nitro group, an amino group, an amidino group, a hydrazine, a hydrazone, a carboxylic acid group or a salt thereof, a sulfonic acid group or a salt thereof, a phosphoric acid group or a salt thereof, a $C_1$-$C_{10}$ alkyl group, a $C_1$-$C_{10}$ alkoxy group, a phenyl group, a naphthyl group, or an anthryl group.

14. The organic light-emitting diode of claim 1, wherein the amine-based compound is represented by Formula 1a, and the anthracene-based compound is represented by Formula 2a:

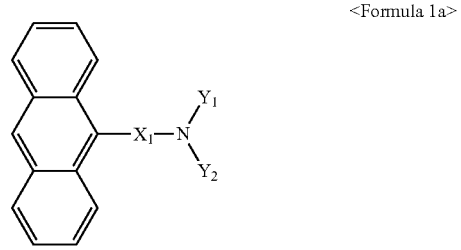

<Formula 1a> wherein in Formula 1a:

$X_1$ is a phenylene group; or a phenylene group substituted with at least one of a deuterium atom, —F, a cyano group, a nitro group, a methyl group, an ethyl group, an n-propyl group, an iso-propyl group, an n-butyl group, an iso-butyl group, a tert-butyl group, or a phenyl group; and $Y_1$ and $Y_2$ are each independently:

i) a phenyl group, a fluorenyl group, or a dibenzofuranyl group;

ii) a phenyl group, a fluorenyl group, or a dibenzofuranyl group substituted with at least one of a deuterium atom, —F, a cyano group, a nitro group, a methyl group, an ethyl group, an n-propyl group, an iso-propyl group, an n-butyl group, an iso-butyl group, or a tert-butyl group;

iii) a phenyl group, a fluorenyl group, or a dibenzofuranyl group substituted with at least one of a methyl group, an ethyl group, an n-propyl group, an iso-propyl group, an n-butyl group, an iso-butyl group, or a tert-butyl group substituted with at least one of a deuterium atom, —F, a cyano group, or a nitro group; or iv) a phenyl group, a fluorenyl group, or a dibenzofuranyl group substituted with at least one of a phenyl group, a naphthyl group, an anthracenyl group, or a fluorenyl group, and <Formula 2a>

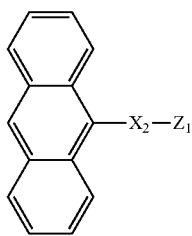

<Compound 1>

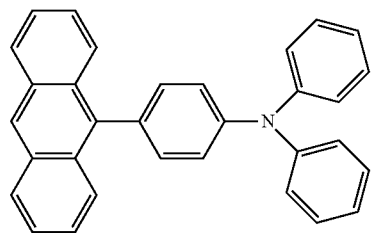

wherein in Formula 2a:
$X_2$ is a phenylene group; or a phenylene group substituted with at least one of a deuterium atom, —F, a cyano group, a nitro group, a methyl group, an ethyl group, an n-propyl group, an iso-propyl group, an n-butyl group, an iso-butyl group, a tert-butyl group, or a phenyl group; and
$Z_1$ is at least one group represented by one of Formulas 3a to 3e:

<Compound 2>

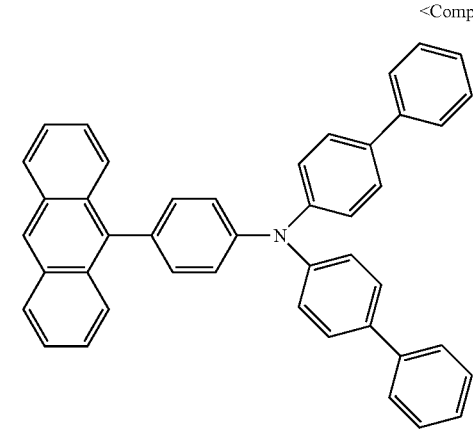

<Formula 3a>

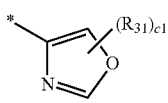

<Formula 3b>

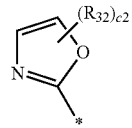

<Formula 3c>

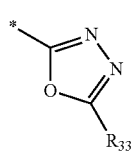

<Compound 3>

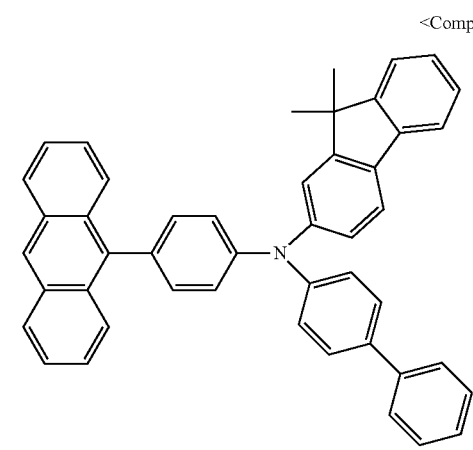

<Formula 3d>

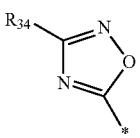

<Formula 3e>

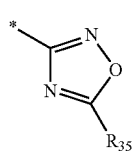

wherein in Formulas 3a to 3e:
$R_{31}$ to $R_{35}$ are each independently a hydrogen atom, a deuterium atom, —F, a cyano group, a methyl group, an ethyl group, a phenyl group, a biphenyl group, or a naphthyl group;
c1 and c2 are each independently an integer of 0 to 4, and when c1 is an integer of 2 or more, the 2 or more $R_{31}$ groups are the same or different, and when c2 is an integer of 2 or more, the 2 or more $R_{32}$ groups are the same or different; and
* is a bonding site to $X_2$.

15. The organic light-emitting diode of claim 1, wherein the amine-based compound is one of Compounds 1 to 5, and the anthracene-based compound is one of Compounds 6 to 11:

<Compound 4>

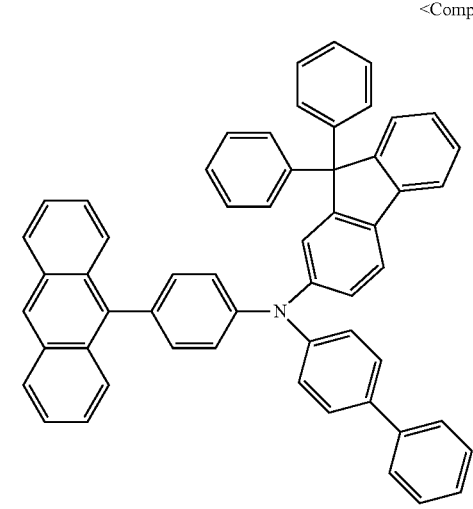

<Compound 5>
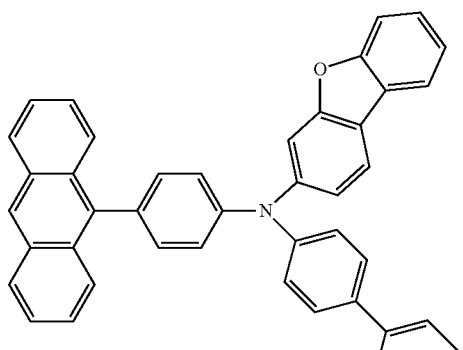

<Compound 6>
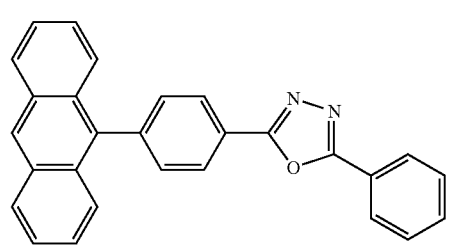

<Compound 7>
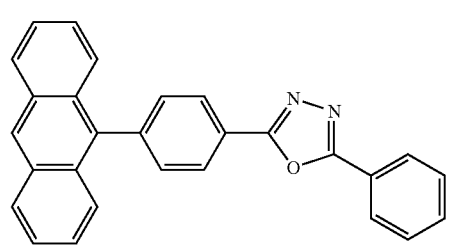

<Compound 8>
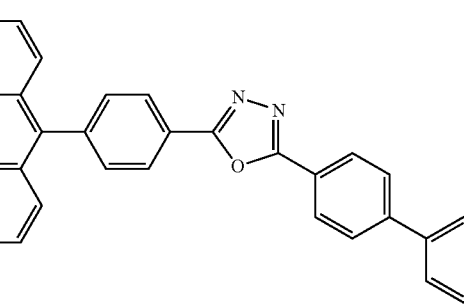

<Compound 9>
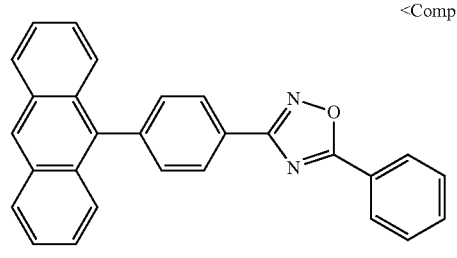

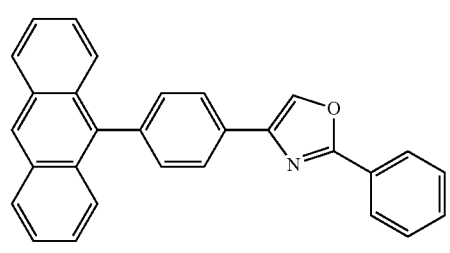

<Compound 10>
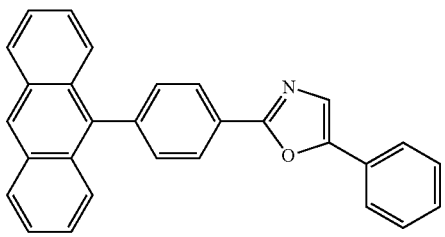

<Compound 11>
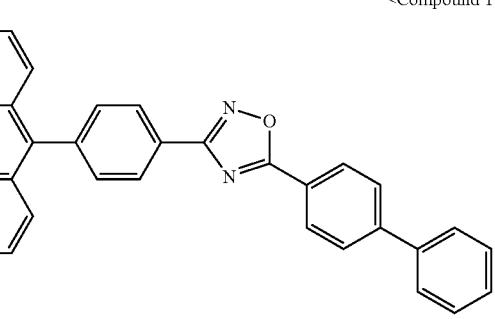

16. The organic light-emitting diode of claim 1, wherein the organic layer comprises:

a hole transport region between the first electrode and the emission layer further comprising at least one of a hole injection layer, a hole transport layer, a functional layer having both hole injection ability and hole transport ability, a buffer layer, and/or an electron blocking layer; and an electron transport region between the emission layer and the second electrode further comprising at least one of an electron transport layer, and an electron injection layer.

17. The organic light-emitting diode of claim 1, wherein the amine-based compound and the anthracene-based compound are included in the emission layer.

18. The organic light-emitting diode of claim 17, wherein the amine-based compound and the anthracene-based compound are co-deposited.

19. The organic light-emitting diode of claim 17, wherein the emission layer includes a first emission layer and a second emission layer, and the first emission layer includes the amine-based compound and the second emission layer includes the anthracene-based compound.

20. The organic light-emitting diode of claim 19, wherein the first emission layer is between the second emission layer and the first electrode.

* * * * *